(12) United States Patent
Lutz et al.

(10) Patent No.: US 10,963,245 B2
(45) Date of Patent: Mar. 30, 2021

(54) ANCHORED DATA ELEMENT CONVERSION

(71) Applicant: Arm Limited, Cambridge (GB)

(72) Inventors: David Raymond Lutz, Austin, TX (US); Neil Burgess, Cardiff (GB); Christopher Neal Hinds, Austin, TX (US); Nigel John Stephens, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/424,718

(22) Filed: May 29, 2019

(65) Prior Publication Data

US 2020/0249942 A1 Aug. 6, 2020

Related U.S. Application Data

(63) Continuation-in-part of application No. 16/268,665, filed on Feb. 6, 2019, now Pat. No. 10,459,688.

(51) Int. Cl.
*G06F 9/30* (2018.01)
*H03M 7/24* (2006.01)

(52) U.S. Cl.
CPC ........ *G06F 9/30025* (2013.01); *G06F 9/3001* (2013.01); *G06F 9/30145* (2013.01); *H03M 7/24* (2013.01)

(58) Field of Classification Search
CPC ...................................................... H03M 7/24
USPC ........................................................ 708/503
See application file for complete search history.

(56) References Cited

U.S. PATENT DOCUMENTS

| | | |
|---|---|---|
| 6,633,895 B1 | 10/2003 | Bass et al. |
| 8,984,042 B2 | 3/2015 | Gschwind |
| 9,270,646 B2 | 2/2016 | Shelest |
| 9,665,347 B2 | 5/2017 | Lutz et al. |
| 9,690,543 B2 | 6/2017 | Lutz et al. |
| 9,703,529 B2 | 7/2017 | Lutz et al. |
| 9,703,531 B2 | 7/2017 | Lutz et al. |
| 9,720,646 B2 | 8/2017 | Burgess et al. |
| 9,733,899 B2 | 8/2017 | Lutz et al. |
| 9,766,857 B2 | 9/2017 | Lutz et al. |
| 9,766,858 B2 | 9/2017 | Lutz et al. |
| 9,778,906 B2 | 10/2017 | Lutz et al. |
| 9,886,239 B2 | 2/2018 | Larri et al. |
| 9,928,031 B2 | 3/2018 | Burgess et al. |

(Continued)

FOREIGN PATENT DOCUMENTS

| | | |
|---|---|---|
| GB | 2 454 201 | 5/2009 |
| WO | 2018/138469 | 8/2018 |

OTHER PUBLICATIONS

Office Action dated Jun. 19, 2020 for U.S. Appl. No. 16/268,692, 14 pages.

(Continued)

*Primary Examiner* — Tan V Mai

(74) *Attorney, Agent, or Firm* — Nixon & Vanderhye P.C.

(57) ABSTRACT

An apparatus is provided, that includes an instruction decoder responsive to an anchored-data processing instruction, to generate one or more control signals. Conversion circuitry is responsive to the one or more control signals to perform a conversion from a data value to an anchored-data select value. The conversion is based on anchor metadata indicative of a given range of significance for the anchored-data select value. Output circuitry is responsive to the one or more control signals, to write the anchored-data select value to a register.

20 Claims, 20 Drawing Sheets

(56) References Cited

U.S. PATENT DOCUMENTS

2016/0124710 A1   5/2016  Lutz et al.
2018/0217815 A1   8/2018  Hinds et al.

OTHER PUBLICATIONS

International Search Report and Written Opinion of the International Searching Authority for PCT/GB2019/053363 dated Mar. 12, 2020, 13 pages.
Hida et al., "Algorithms for Quad-Double Precision Floating Point Arithmetic", Proceedings 15th IEEE Symposium on Computer Arithmetic. ARITH-15 2001, Jun. 11-13, 2001 8 pages.
Bedichek, "Some Efficient Architecture Simulation Techniques", Winter 1990 USENIX Conference, 12 pages.
U.S. Appl. No. 16/268,665, filed Feb. 6, 2019, Inventor: Burgess et al.
U.S. Appl. No. 16/268,692, filed Feb. 6, 2019, Inventor: Lutz et al.
International Search Report and Written Opinion of the International Searching Authority for PCT/GB2020/050219 dated Apr. 2, 2020, 16 pages.
N. Burgess et al, "High-Precision Anchored Accumulators for Reproducible Floating-Point Summation" *IEEE Transactions on Computers*, vol. 68, No. 7, Jul. 2019, pp. 967-978.
D.R. Lutz et al, "High-Precision Anchored Accumulators for Reproducible Floating-Point Summation" *2017 IEEE 24$^{th}$ Symposium on Computer Arithmetic*, Jul. 1, 2017, pp. 98-105.

| HPA[63:61] | Datatype |
|---|---|
| 0m₁m₀ | HPA digit |
| 1s0 | ±Infinity |
| 101 | DNaN |
| 111 | Sat |

| | op2 | | | | |
|---|---|---|---|---|---|
| op1 | Num | Sat | +∞ | −∞ | DNaN |
| Num | Num, Sat | Sat | +∞ | −∞ | DNaN |
| Sat | Sat | Sat | +∞ | −∞ | DNaN |
| +∞ | +∞ | +∞ | +∞ | DNaN | DNaN |
| −∞ | −∞ | −∞ | DNaN | −∞ | DNaN |
| DNaN | DNaN | DNaN | DNaN | DNaN | DNaN |

(Li' = Li if Li[63] = 1 (special value)
or (optionally) if Ui[63] = 1)

ANCHORED DATA ELEMENT CONVERSION

This application is a Continuation-in-Part of U.S. application Ser. No. 16/268,665 filed 6 Feb. 2019, the entire contents of which is hereby incorporated by reference.

TECHNICAL FIELD

The present disclosure relates to data processing.

DESCRIPTION

It is common to use floating-point (FP) representation in data processing systems. A floating-point number includes a significand and an exponent indicating a significance of the bits of the significand. This allows numeric values over a large range to be represented using a finite number of bits. However, a problem with floating-point arithmetic is that calculations are generally non-associative, a fact that makes sums problematic. In particular programmers need to worry about obtaining different results, even when adding a small number of values.

To seek to address the associativity issue, a new datatype has been proposed, called a high-precision anchored (HPA) number. A high-precision anchored (HPA) number may comprise a pair (i, a) consisting of a long two's complement integer i (e.g. 200 bits), and a smaller anchor integer a that represents the weights of the bits of i, typically by specifying the significance of the smallest bit of i. Floating-point values can be converted into HPA form, and thereafter additions can be performed in an associative manner.

SUMMARY

Viewed from a first example configuration, there is provided an apparatus comprising: an instruction decoder responsive to an anchored-data processing instruction, to generate one or more control signals; conversion circuitry, responsive to the one or more control signals, to perform a conversion from a data value to an anchored-data select value, wherein the conversion is based on anchor metadata indicative of a given range of significance for the anchored-data select value; and output circuitry, responsive to the one or more control signals, to write the anchored-data select value to a register.

Viewed from a second example configuration, there is provided a data processing method comprising: receiving an anchored-data processing instruction generating one or more control signals in response to the anchored-data processing instruction; performing, in response to the one or more control signals, a conversion from a data value to an anchored-data select value, wherein the conversion is based on anchor metadata indicative of a given range of significance for the anchored-data select value; and writing, in response to the one or more control signals, the anchored-data select value to a register.

Viewed from a third example configuration, there is provided a computer program for controlling a host data processing apparatus to provide an instruction execution environment comprising: conversion program logic to perform a conversion from a data value to an anchored-data select value, wherein the conversion is based on anchor metadata indicative of a given range of significance for the anchored-data select value; and output program logic to write the anchored-data select value to a data structure in the instruction execution environment.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
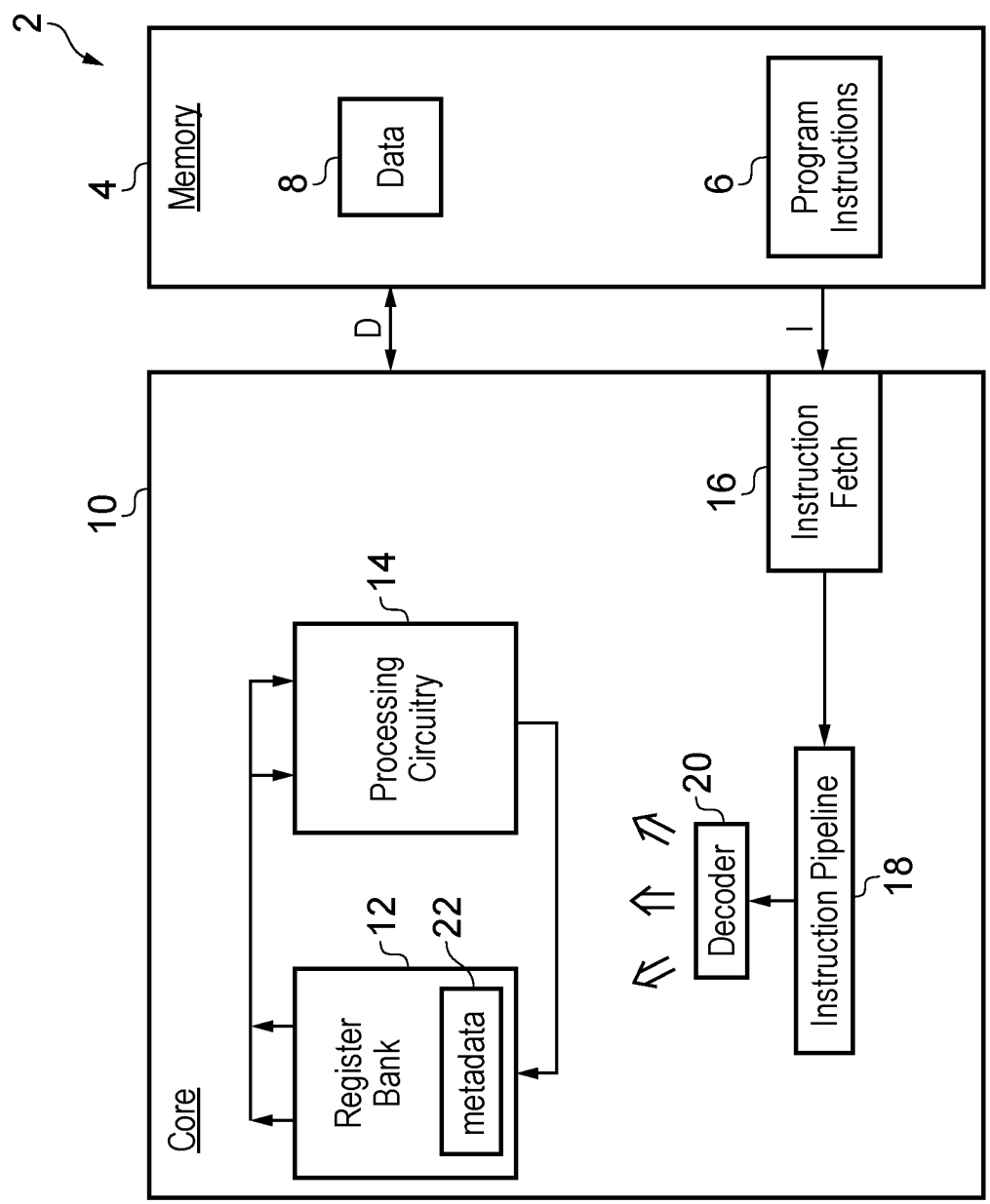
FIG. 1 schematically illustrates a data processing apparatus.

As mentioned earlier, a problem with floating-point arithmetic is that calculations are generally non-associative, a fact that makes sums problematic. For example, when adding several floating-point values, each time another value is added to the result of the previous addition, the result is rounded and normalised, which means that the overall result is different depending on the order in which the values are added. This makes it difficult to parallelize floating-point arithmetic, because sums are not reproducible unless completed in the exact same order. To generate a reproducible result, a series of additions or subtractions typically have to be performed sequentially, which can make floating-point arithmetic relatively slow.

Programmers therefore use higher accuracy than they need, in the hope of avoiding such different results. Programmers, therefore, cannot easily parallelize code because sums are not reproducible unless computed in the exact same order.

The problem is especially acute for high-performance computing (HPC), where programs may need to add millions of values. Programmers would like to parallelize these problems, but then the lack of reproducibility makes debugging difficult. Every different machine configuration will produce different answers even if the reprogramming for those machines is done perfectly.

As mentioned above, to seek to address the associativity issue, a new datatype has been proposed, called a high-precision anchored (HPA) number. An HPA number may comprise a pair (i, a) consisting of a long two's complement integer i (e.g. 200 bits), and a smaller anchor integer a that represents the weights of the bits of i, typically by specifying the significance of the smallest bit of i. The pair is somewhat analogous to an FP number's significand and exponent values, but differs in that the long integer i is not normalized and is usually much larger than an FP significand, and in that the anchor value a is fixed for all operands in an HPA operation. Adding FP numbers may cause the exponent to change, but adding HPA numbers does not change the anchor.

As a trivial example, consider an HPA representation consisting of a 10-bit i and an anchor value a=−4. Some values in this format are given in Table 1.

TABLE 1 example HPA numbers (i, −4)

| i (binary)   | value (decimal) |
|--------------|-----------------|
| 00000_00001  | 0.0625          |
| 00000_01000  | 0.5             |
| 00000_11000  | 1.5             |
| 00001_00000  | 2.0             |
| 00100_11000  | 9.5             |
| 11111_01000  | −1.5            |

When adding two of these numbers, say 0.5 and 1.5, the anchor (−4) does not change, and the sum is conveniently given by adding just the i values. Since HPA sums are just two's complement addition, when the range is sufficient, HPA sums are associative, exact and repeatable.

FP numbers have a large range. Double precision numbers (FP64) can be smaller than $2^{-1000}$ and larger than $2^{1000}$, but most accumulations do not span this entire range. Indeed, it is hard to imagine the kind of problem that would meaningfully accumulate values over all of that range, and even for HPC most accumulations happen over a limited range. It is expected that 200 bits or so is more than enough for almost all applications requiring wider than double-precision arithmetic. Suppose that a programmer determines that all of the data for a particular sum has magnitude less than $2^{100}$, and that bits with magnitude below $2^{-50}$ won't affect the sum in any meaningful way. If the data is added using the HPA format (i, −50) with 200-bit i, then the accumulation is associative and at least $2^{49}$ of these numbers can be added in any order without worrying about overflow.

Most modern architectures have SIMD (Single Instruction Multiple Data) units which could be used to represent long integers. With a bit of extra logic to facilitate carries between 64-bit lanes, a 256-bit SIMD unit could be used to add 256-bit integers. Alternatively, carries between lanes could be avoided for most additions by using a redundant representation discussed in more detail later. One approach for representing an HPA (anchored-data) value (or long integer) in a SIMD register could be to allocate a number of HPA (anchored-data) elements of the HPA value to the respective vector lanes within a single SIMD register. Alternatively, as discussed below another approach can be that the respective anchored-data elements of an HPA value could be allocated to corresponding vector lanes within a number of different SIMD registers, so that each portion of the overall anchored-data value is in a corresponding position of a different vector register, and a single vector register may hold a number of anchored-data elements each of which forms part of a different anchored-data value (HPA value).

Before discussing the embodiments with reference to the accompanying figures, the following description of embodiments is provided.

According to some embodiments there is provided an apparatus comprising: an instruction decoder responsive to an anchored-data processing instruction, to generate one or more control signals; conversion circuitry, responsive to the one or more control signals, to perform a conversion from a data value to an anchored-data select value, wherein the conversion is based on anchor metadata indicative of a given range of significance for the anchored-data select value; and output circuitry, responsive to the one or more control signals, to write the anchored-data select value to a register.

The anchored-data processing instruction makes it possible to convert a data value into an anchored-data select value, which is then stored in a register. The conversion takes place using anchor metadata, which indicates a given range of significance for the anchored-data select value, which is generated. An anchored-data select value can be thought of as containing some of the 'integer' bits of an HPA number. In particular, an anchored-data select value need not include any overlap bits.

In some embodiments, the conversion circuitry is adapted to extract selected bits from the data value corresponding to the given range of significance for the anchored-data select value. The bits that are extracted from the data value could therefore depend on a given window of significance, as indicated by the anchor metadata, with bits that fall outside this window either being disregarded or potentially causing an error condition to occur (e.g. an overflow or underflow).

In some embodiments, the data value is either a floating-point number or at least a part of a product of two floating-point numbers. The part could, for instance, be the significand of the product of two floating-point numbers.

In some embodiments, the anchored-data processing instruction is an anchored-data multiplication instruction; and the anchored-data multiplication instruction causes the processing circuitry to perform a multiplication between two floating-point numbers to produce the data value comprising a sign bit, an exponent and an unrounded significand comprising at least one integer bit. In an anchored-data multiplication instruction, two floating-point numbers are multiplied together to produce a product. This may involve the separate calculation of the product's significand, its exponent, and its sign. In some embodiments, the calculation of the significand takes place by multiplying the significands of the two floating-point numbers—including any implicit integer bits occurring prior to the decimal point. The result of this calculation is an unrounded significand, which itself includes at least one bit that represents part of an integer. For instance, the significand 1.0 may be represented by the bits 10 in a register. The first bit '1' represents the integer component of the significand. Similarly, the decimal value 1.5 may be represented in binary as 1.1. This, in turn, may be stored in a register as 11. Again, the first bit '1' represents the integer bits of the significand.

In some embodiments, the conversion circuitry is adapted to extract selected bits from the unrounded significand that correspond to the given range of significance for the anchored-data select value; and a significance of the selected bits is determined from at least the exponent. As previously mentioned, determining the product may include determining the exponent of that product, e.g. at least partly from the exponent of the two operators that are being multiplied together. The extraction or selection of bits from the calculated significand may then take place based, at least in part, on the calculated exponent.

In some embodiments, the selected bits are selected from bits making up the unrounded significand having a significance that falls within the given range of significance for the anchored-data select value. For example, the selected bits may be selected if the exponent of the product indicates that they would fall within the window defined by the metadata of the anchored-data select value.

In some embodiments, the anchor metadata comprises a lane indication of whether the anchored-data select value belongs to a bottom lane or to a top lane. The top lane can be considered to be the lane containing the most significant bits of a number, whereas the bottom lane can be considered to be the lane containing the least significant bits of the number (e.g. an HPA number).

In some embodiments, the anchored-data multiplication instruction causes the processing circuitry to perform a multiplication between two floating-point numbers to produce the data value comprising a sign bit, an exponent and an unrounded significand comprising at least one integer bit; the conversion circuitry is adapted to extract selected bits from the unrounded significand that correspond to the given range of significance for the anchored-data select value; and when the lane indication indicates that the anchored-data select value belongs to the bottom lane: if a significance of a least significant bit of the data value is lower than a lower bound of the given range of significance then the conversion circuitry is adapted to signal an underflow, otherwise the conversion circuitry is adapted to pad the selected bits extracted from the unrounded significand at a least significant position. The significance of the unrounded significand may be determined, for instance, based on its corresponding exponent. In extracting the bits for a bottom lane, if there are bits of the unrounded significand that are less significant than the window defined by the metadata of the anchored-data select value, then an underflow occurs. That is that there are bits in the significand that are considered to be too insignificant to include. This results in an underflow condition being signalled.

The response to this could be to signal an underflow error. However, in some embodiments, the underflow is disregarded since it has already been determined by, e.g. the programmer, that bits of the particular significance can be ignored. If the bits do not have a significance that is less than the lower bound of the given range, then padding occurs in a least significant position for any 'missing' bits. That is, if the lower bound of the given range of significance indicates that the anchored-data select value has a significance of $2^{15}$ and the least significant bit of the data value is $2^{16}$ then padding comprising a single bit must be inserted in a least significant position of the data value. In the case of a non-bottom lane, no underflow needs to be signalled, since the bits might be of appropriate significance for a lower lane (one nearer the bottom lane) or the bottom lane itself. The values of the bits making up the padding are dependent on whether the result of the multiplication is positive or negative. In particular if the result of the multiplication is positive, then the padding will be with zeros. It will be appreciated that in integer arithmetic, a positive number is made negative by calculating the twos complement, i.e. by firstly inverting the bits of the number and then adding '1'. Hence, when the result of the multiplication is negative, the bits making up the magnitude of the result are padded with zeros, the bits are then inverted, and '1' is added.

In some embodiments, the anchored-data multiplication instruction causes the processing circuitry to perform a multiplication between two floating-point numbers to produce the data value comprising a sign bit, an exponent and an unrounded significand comprising at least one integer bit; the conversion circuitry is adapted to extract selected bits from the unrounded significand that correspond to the given range of significance for the anchored-data select value; and when the lane indication indicates that the anchored-data select value belongs to the top lane: if a significance of a most significant bit of the data value is higher than an upper bound of the given range of significance then the conversion circuitry is adapted to signal an overflow, otherwise the conversion circuitry is adapted to sign extend the selected bits extracted from the unrounded significand. The significance of the unrounded significand may be determined, for instance, based on its corresponding exponent. In extracting the bits for a top lane, if there are bits of the unrounded significand that are more significant than the window defined by the metadata of the anchored-data select value, then an overflow occurs. That is that there are bits in the significand that are considered to be too significant to be included. This results in an overflow condition being signalled. The response to this could be to signal an underflow error. If the bits do not have a significance that is more than the upper bound of the given range, then padding occurs via sign extension for any 'missing' bits. That is, if the upper bound of the given range of significance indicates that the anchored-data select value has a significance of $2^{30}$ and the most significant bit of the data value is $2^{27}$ then padding occurs at a most significant position. The value of the padding will depend on whether the sign bit is positive or negative such that bits are added in order to avoid altering the value itself. For instance, if the sign bit is positive then padding takes place using zeros in a most significant position. If the sign bit is negative then the extracted bits (which represent the magnitude) are firstly padded with zeros in a most significant position. This does not change the magnitude. The twos complement is then calculated (in order to represent the number as an integer in negative form) by inverting the padded bits and adding '1'. In the case of a non-top lane, no overflow needs to be signalled, since the bits might be of appropriate significance for a higher lane (one nearer the top lane) or the top lane itself.

In some embodiments, the anchored-data multiplication instruction causes the processing circuitry to perform a multiplication between two floating-point numbers to produce the data value comprising a sign bit, an exponent and an unrounded significand comprising at least one integer bit; the conversion circuitry is adapted to extract selected bits from the unrounded significand that correspond to the given range of significance for the anchored-data select value; and when the lane indication indicates that the anchored-data select value belongs to neither the bottom lane nor the top lane: when a significance of a least significant bit of the data value is higher than a lower bound of the given range of significance then the conversion circuitry is adapted to pad the selected bits extracted from the unrounded significand at a least significant position; and when a significance of a most significant bit of the data value is lower than an upper bound of the given range of significance then the conversion circuitry is adapted to pad the selected bits extracted from the unrounded significand at a most significant position. Therefore, when the lane is neither the top lane nor the bottom lane, padding is dependent on the relationship between the extracted bits and the bounds of the range of significance. As previously described, the bits that make up the padding will depend on the sign bit of the data value.

In some embodiments, in response to one of the two float-point numbers being a floating point special case when the lane indication indicates that the anchored-data select value belongs to the top lane, the floating point special case is indicated in the register. Floating point special cases may include NaN, positive infinity, negative infinity. In such cases, the anchored-data select value may be encoded so as to represent the special case that has occurred.

In some embodiments, the anchored-data processing instruction is an anchored-data extraction instruction; and the data value is a floating-point number comprising a sign bit, an exponent, and a significand. An anchored-data extraction instruction extracts the relevant bits from the significand of a floating-point number in order to form the anchored-data select value.

In some embodiments, the conversion circuitry is adapted to extract selected bits from the unrounded significand that correspond to the given range of significance for the anchored-data select value; and a significance of the selected bits is determined from at least the exponent. For example, the significance of the selected bits could be determined based on a combination of the component and a range of significance indicated by the anchor metadata.

In some embodiments, the selected bits are selected from bits making up the unrounded significand having a significance that falls within the given range of significance for the anchored-data select value.

In some embodiments, the anchor metadata comprises a lane indication of whether the anchored-data select value belongs to a bottom lane or to a top lane. The top lane can be considered to be the lane containing the most significant bits of a number, whereas the bottom lane can be considered to be the lane containing the least significant bits of the number (e.g. an HPA number).

In some embodiments, the conversion circuitry is adapted to extract selected bits from the data value that correspond to the given range of significance for the anchored-data select value; and when the lane indication indicates that the anchored-data select value belongs to the bottom lane: if a significance of a least significant bit of the data value is lower than a lower bound of the given range of significance then the conversion circuitry is adapted to signal an underflow, otherwise the conversion circuitry is adapted to pad the selected bits extracted from the unrounded significand at a least significant position. As above, when it is indicated that the anchored-data select value is to belong to a bottom lane, an underflow may occur if the least significant bit of the data value to be converted is lower than the lower bound of the given range of significance, e.g. as specified by the metadata. If no underflow occurs, then padding occurs, as appropriate, based on whether the data value is positive or negative.

In some embodiments, the conversion circuitry is adapted to extract selected bits from the data value that correspond to the given range of significance for the anchored-data select value; and when the lane indication indicates that the anchored-data select value belongs to the top lane: if a significance of a most significant bit of the data value is higher than an upper bound of the given range of significance then the conversion circuitry is adapted to signal an overflow, otherwise the conversion circuitry is adapted to pad the selected bits extracted from the unrounded significand at a most significant position. Similarly to the above, and as previously described, when it is indicated that the anchored-data select value is to belong to a top lane, an overflow may occur if the most significant bit of the data value to be converted is higher than the upper bound of the given range of significance, e.g. as specified by the metadata. If no overflow occurs, then padding occurs.

In some embodiments, the conversion circuitry is adapted to extract selected bits from the data value that correspond to the given range of significance for the anchored-data select value; and when the lane indication indicates that the anchored-data select value belongs to neither the bottom lane: when a significance of a least significant bit of the data value is higher than a lower bound of the given range of significance then the conversion circuitry is adapted to pad the selected bits extracted from the unrounded significand at a least significant position; and when a significance of a most significant bit of the data value is lower than an upper bound of the given range of significance then the conversion circuitry is adapted to pad the selected bits extracted from the unrounded significand at a most significant position. Therefore, when the lane is neither the top lane nor the bottom lane, padding is dependent on the relationship between the extracted bits and the bounds of the range of significance.

In addition, the configurations described below may also be relevant to the present technique.

In techniques discussed below, an apparatus may have processing circuitry to perform data processing and an instruction decoder to control the processing circuitry to perform an anchored-data processing operation to generate an anchored-data element, in which the anchored-data element has an encoding including type information. The type information indicates whether the anchored-data element represents either a portion of bits of a two's complement number (where that portion of bits corresponds to a given range of significance representable using the anchored-data element) or represents a special value other than the portion of bits of the two's complement number within the given range of significance. The provision of an encoding which can represent a special value other than a portion of a two's complement number can be useful to enable the anchored-data format to represent special values of floating-point numbers, such as Not-a-Number (NaN) or infinities. Also a special value can be useful for representing cases where the given range of significance assumed for the anchored-data element is not appropriate for representing the number which results from a processing operation performed by the processing circuitry.

One alternative approach for handling special values could be to encode the fact that the anchored-data element represents a special value separate from the anchored-data element itself, within a separate register or within a register which defines anchor information or metadata which identifies the given range of significance that is representable using the anchored-data element or other information about the way in which the anchored-data element is encoded. However, a problem with this approach is that this may require the processing circuitry, when performing an anchored-data processing operation, to update two separate destination registers. This can be undesirable for some micro-architecture implementations as it may require two separate register write ports to be provided for the processing circuitry. There may be relatively few instructions in an instruction set architecture that need to update two or more destination registers, and so many micro-architectural implementations may only provide one register write port. Therefore, avoiding a need to provide a second register write port to support encoding of special values can help to reduce circuit area and power consumption. Alternatively, even if the apparatus has more than one register write port, when processing an anchored-data processing operation, the second write port could be used to execute a different register write in response to a different instruction, rather than being used for the same instruction as the first register write port. Hence, special values of anchored-data values can be represented without needing to use a second register write port, which can save circuit area and/or enable better performance by enabling the available register write ports to be used for handling additional instructions.

The processing circuitry may store the type information in the same register as the anchored-data element.

In one example the anchored-data processing operation may comprise a float-to-anchored conversion operation to convert a floating-point value to the anchored-data element. Encoding of special values may be particularly useful for a float-to-anchored conversion operation because this may help accommodate special values of floating-point numbers. For example, when the floating-point value to be converted represents a special number, such as positive or negative infinity or a NaN, the processing circuitry may then generate the anchored-data element with the type information indicating that the anchored-data element represents the special value. The type information may distinguish whether the special number represented by the floating-point value is positive infinity, negative infinity or a NaN. Hence, the type information may have different encodings allocated to represent each of the cases of positive infinity, negative infinity and NaN.

In the float-to-anchored conversion operation, the processing circuitry may generate the anchored-data element based on anchor metadata indicative of the given range of significance for the anchored-data element. For example, the anchored data element could specify the significance of a least significant bit of the anchored-data element (where the significance indicates the power of two represented by that least significant bit) and may provide a parameter indicative of the width (number of bits) of the portion of the two's complement number represented by the anchored data element. The float-to-anchored conversion operation may use this metadata to determine how to set the values of the bits within the anchored-data element based on the floating point number provided. The anchor metadata could also indicate other properties, such as a number of overlap bits as discussed below and/or lane information indicating, for an anchor value made up of one or more anchored-data elements, the relative positions of the anchored-data element relative to other elements, e.g. whether the anchored-data element represents the most significant element, least significant element or an intermediate element of the anchored-data value. This can allow anchored-data values to represent a long two's complement number using a number of vector elements.

The examples above discuss generation of an individual data element, but it will be appreciated that operations on anchored-data elements may be implemented in a vector instruction where a number of lanes of processing may be performed in response to one instruction, each lane of processing generating a respective anchored-data element based on corresponding operands provided as inputs. For the float-to-anchored conversion operation, a respective floating point value could be provided in each lane and converted into respective anchored-data elements based on the vector of anchor metadata. For addition operations as discussed below, a number of independent respective pairs of anchor-data elements could be added in a vector operation. As discussed below, it can be useful to stripe the respective anchored-data elements of a given anchored-data value across the corresponding data elements at corresponding positions in a number of different vector registers. However, it would also be possible to represent the respective elements of a single anchored-data value in the respective vector lanes of a single vector register.

In some examples, the type information may specify whether the anchored-data element is a saturated type of anchored-data element. A saturated type of anchored-data elements may be one which is dependent on a previous anchored-data processing operation which caused a corresponding anchored-data element to overflow, or a previous float-to-anchored conversion operation for which the floating-point value being converted falls outside an allowed numeric range for an anchored-data value comprising one or more anchored-data elements. The saturated type may be supported in addition to the special values representing positive infinity, negative infinity or NaN as discussed above, but unlike these the saturated type does not have an analogous special value in the floating-point representation. The saturated type can be used to indicate cases when the range of significance defined for an anchored-data value is inappropriate for accommodating the required inputs to anchored-data processing operations. For example, if the metadata associated with an anchored-data value defines a certain numeric range, but then a floating-point value is provided as an input which is outside that range, then the correct numeric results of processing that floating-point value cannot be adequately represented using the range of significance defined by the anchor metadata and the saturated type of anchored-data element can be used to indicate this.

Hence, in one example, if a float-to-anchored conversion operation is performed to convert a floating-point value to the anchored-data element, the processing circuitry may set the type of information of the anchored-data element to indicate the saturated type when one of: said anchored-data element is to represent a most significant element of an anchored-data value comprising one or more anchored-data values, and representing the floating-point value as a two's complement number would require at least one bit of greater significance than the given range of significance representable using said anchored-data element; or said anchored-data element is to represent a least significant element of an anchored-data value comprising one or more anchored-data values, and representing the floating-point value as a two's complement number would require at least one bit of lower significance than the given range of significance representable using said anchored-data element.

Hence, whereas if the floating point value being converted represents a special number then the anchored-data value may be encoded as a special value representing one of positive infinity, negative infinity or NaN as discussed above, if the fact that the floating point value does not map to a two's complement number within the range representable using the anchored data element is due to inappropriate setting of the range defining information for that anchored-data element, then instead the saturated type can be used. Distinguishing the saturated type from the other types of special value can be used for enabling software code to identify the cause of a failed sequence of operations including processing of anchored-data values.

The encoding of the type information may be incapable of distinguishing, for an anchored-data element specified as the saturated type, whether the anchored-data element represents a positive or negative value. In contrast, for infinities, different type encodings may be provided for positive infinity and negative infinity respectively. This recognises that when anchor metadata defining the allowable range for an anchored-data value has been set inappropriately so that saturation occurs, it is not important to know whether the value is positive or negative, since in these cases it is likely that the code will likely be later rerun using different metadata. By providing an encoding which cannot distinguish positive and negative values marked as saturated type, this can save some encoding space which can enable more efficient encoding of the anchored-data element and allow a greater number of bits to be preserved for representing bits of the two's complement number represented.

The processing circuitry may have adding circuitry to perform an addition of two anchored-data elements to generate a result anchored-data element. As discussed above, in some cases this may be implemented as a vector operation so that a vector of first anchored-data elements and a vector of second anchored-data elements may be added, with a number of independent additions of the elements at corresponding positions within the respective vectors performed in response to the vector instruction to generate a result vector comprising a number of result anchored-data elements. However it would also be possible to implement a scalar add instruction which performs a single addition of two anchored-data elements to generate a result an anchored-data element.

When performing such an addition of two anchored-data elements, sometimes an overflow could occur. For example, in an addition generating the result anchored-data element which is to represent the most significant element of an anchored-data value, an overflow may occur if the sum of the two anchored-data elements being added would require at least one bit which is more significant than the highest bit representable by the anchored-data value within the allowed range of significance defined by the anchor metadata. If an overflow occurs when generating a result anchored-data element in an addition where the result anchored-data element is the most significant element of an anchored-data value, then the adding circuitry may generate the result anchored-data element with the type information specifying that the result anchored-data element is the saturated type.

The type information of an anchored-data element may be encoded in a number of ways. However, in one example the anchored-data element may have an encoding in which when a predetermined bit of the anchored-data element has a first value, then the anchored-data element represents the portion of bits of the two's complement number, while when the predetermined bit of the anchored-data element has a second value then the anchored-bit element represents the special value. For example the predetermined bit may be the most significant bit of the anchored-data element. Hence, this can be efficient to decode because the decoder can check from a single bit whether it is necessary to examine any further bits of the anchored-data element to identify the particular form of special value represented, or whether the element simply represents a portion of a two's complement number which is not a special value. For example, at least one further bit may represent the particular type of special value represented, in cases when the predetermined bit has the second value. On the other hand in cases when the predetermined bit has the first value, the at least one further bit could be reused to either represent part of the portion of the two's complement number itself or to represent at least one overlap bit for accommodating carries from a part of the anchored-data element which does represent a portion of the two's complement number. This provides a particularly efficient encoding since in the more common case where the element does not represent a special value, the bits used for encoding the specific type of special value can be reused for other purposes.

In general, in a given anchored-data processing operation, when an input anchored-data element has the predetermined bit equal to the second value, then the processing circuitry may generate the corresponding result anchored-data element with the predetermined bit equal to the second value. Hence, the predetermined bit may be sticky in the sense that once set in a given series of processing operations, corresponding anchored-data elements generated in subsequent operations continue to retain the predetermined bit equal to the second values to flag that somewhere in that sequence of operations either a floating-point value which is a special number has been encountered or a result of an anchored-data processing operation could not be accurately represented within the given range of significance defined by anchor metadata for a given anchored-data element.

More generally, in a given anchored-data processing operation where an input anchored data element is indicated by the type information to be a special number then a corresponding result anchored-data element may also be indicated with type information specifying that the result anchored-data element represents the special value. Note that the particular form of special value indicated for the result may not always be the same as the form of special value indicated for the input anchored-data element. For example, in an addition of two anchored-data elements, when the type information of the two anchored-data elements indicates that one represents positive infinity and the other represents negative infinity, the result anchored-data element could be generated with the type information specifying that the result represents a NaN.

In some examples, an anchored-data element may be represented using a redundant representation where a number of overlap bits may be allocated within the element to accommodate carries resulting from additions performed within a less significant portion of the data element. This can help to reduce the chance that a series of anchored-data processing operations causes an overflow out of the anchored-data element. The representation may be redundant in the sense that there may be a number of different patterns of bits of an anchored-data value formed of multiple anchored-data elements which could all represent the same numeric value of a two's complement number, with different combinations of overlap bits and non-overlap bits. More information is provided on this below.

Hence, in general an anchored-data element may comprise a N-bit value which includes V overlap bits and W non-overlap bits. The particular number of overlap bits and non-overlap bits could be fixed or could be variable, for example by specifying information in the anchor metadata discussed above.

In a float-to-anchored conversion operation for converting a floating-point value to the anchored-data element, when the floating-point value represents a number other than a special number and the number is within an allowed numeric range for the anchored-data value for which that anchored-data element forms part, the processing circuitry may set the W non-overlap bits of the anchored-data element to represent a portion of bits of the two's complement number which corresponds to the floating-point value. In contrast, the V overlap bits of the anchored-data element may be set to a sign-extension of the W non-overlap bits. Hence, initially the overlap bits may be set to a sign-extension, e.g. all zeros or all ones. However, when the anchored-data element generated by the float-to-anchored conversion operation is then processed in a series of additions then this can result in a number of carries into the overlap bits. To work out the two's complement number represented by the overall anchored-data value in a non-redundant representation, an overlap propagation operation may be provided to propagate the carries represented by the overlap bits of one anchored-data element into the non-overlap bits of the next highest anchored-data element of the anchor-data value.

In some examples, N-V-W may be greater than 0. That is, the overlap bits and the non-overlap bits together do not occupy all of the N bits of the anchored-data element. This is because at least one other bit may be used to represent the type information indicating whether the element represents a special value.

As mentioned above, an overlap propagation operation may be performed periodically to propagate the carries represented by the overlap bits into the next highest data element. An overlap propagation instruction may be provided to control the processing circuitry to perform the overlap propagation operation. In response to the overlap propagation instruction, the processing circuitry may align the V overlap bits of a first anchored-data element with W non-overlap bits of second anchored-data element, and add the aligned overlap and non-overlap bits to generate an updated value for the second anchored-data element. Again this may be performed as a vector operation, with a number of lanes of overlap propagation performed on respective pairs of first and second anchored-data elements in response to a single instruction.

The overlap propagation operation may consider the type information specified in the first and second anchored-data elements, to determine how to generate the updated value for the second anchored-data element. When one of the first anchored-data element and the second anchored-data element has type information specifying that it represents one of the types of special values discussed above, the processing circuitry may retain a previous value of the second anchored-data element. For example, the update of the second anchored-data element may be suppressed, without adding in the aligned overlap bits from the first anchored data element. This ensures that if the sequence of anchored-data processing operations performed earlier resulted in a special value then the performance of the overlap propagation operation does not overwrite that type information and the fact that a special value was encountered can be identified from the end result despite performing the overlap propagation operation. This can make writing or compiling code for performing anchored-data processing operations simpler because it means that whether a special value does not need to be checked as often. Alternatively, in cases when the first anchored-data element is a special value, the type information of the second anchored-data element could be updated to match the type information of the first anchored-data element. This propagates the type information towards higher elements of an HPA value, which can simplify checking of type information after performing a series of anchored-data processing operations.

On the other hand, when the addition of the aligned overlap bits and non-overlap bits causes an overflow of the second anchored-data element, the processing circuitry may set the type information for the second anchored-data element to indicate a saturated type value. Here, an overflow is considered to occur if there has been an overflow from the most significant overlap bit, not if there is an overflow from the non-overlap bits into the overlap bits. In cases where the addition for the overlap propagation operation causes an overflow from the most significant overlap bit then this means that the correct result can no longer be correctly represented in the second anchored-data element and so the saturated type may be specified to enable subsequent instructions to detect that something has gone wrong. For example, this may be a sign that the software code should trigger the overlap propagation operation more frequently.

In use within program code, one use case for the overlap propagation instruction may be to specify a pair of adjacent anchored-data elements of the same anchored-data value as the first and second anchored-data elements respectively (with the second anchored-data element being the element that represents a more significant portion of the anchored-data value than the first anchored-data element). Here, the instruction can be used to propagate the carries from the lower element into the next highest element of the same anchored-data value.

However, another use case may be where the first anchored-data element comprises the most significant anchored-data element of a given anchored-data value, and the second anchored-data element comprises an "empty" anchored-data element which is not yet part of the same anchored-data value as the first anchored-data element. This could be useful for effectively extending the range of the anchored-data value to include an additional element to accommodate the carry bits from the top element of the previously represented anchored-data element, which could be useful if the anchored-data value including the first anchored-data element is subsequently to be added to another anchored-data value which includes bits of greater significance than those of the first anchored-data element.

It will be appreciated that these are just two examples of how the overlap propagation instruction could be used—programmers or compilers may also find other uses.

The processing circuitry may also be responsive to an overlap clearing instruction to clear the overlap bits of a target anchored-data element to zero. This instruction can be used to clear the overlap bits once the overlap propagation instruction has already added those overlap bits into the non-overlap bits of a next highest anchored-data element. The separation of the overlap propagation and clearing operations into two separate instructions can be used to avoid any one instruction needing to update two destination registers which has the advantages discussed above. Other alternative architectures could choose to combine these instructions into a single instruction which could clear the overlap bits of the first anchored-data element in response to the overlap propagation instruction itself. Such a combined overlap propagation instruction which also clears the overlap bits of the first anchored-data element may also be considered an example of an overlap clearing instruction.

In response to the overlap clearing instruction, when the target anchored-data element has type information specifying that it represents a special value, the processing circuitry may retain a previous value of the target anchored-data element, i.e. without clearing the overlap bits. And again this enables the type information to be retained.

In some examples of the overlap clearing instruction, as well as the target anchored-data element (which in a program may be expected to correspond to the least significant element of the pair of first and second elements acted upon by an overlap propagation instruction) the overlap clearing instruction could also specify a second anchored-data element (expected to correspond to the upper element of the pair), and the processing circuitry could also retain the previous value of the target anchored-data element if the type information of the second anchored-data element indicates that it is a special value. Hence, even though the clearing of the overlap bits itself does not depend on the second anchored-data element, considering the type information of that second anchored-data element could allow the overlap clearing instruction to proceed in an analogous manner to the overlap propagation instruction so that there is no change in a given pair of lower and upper anchored-data elements of the same anchored-data value in cases where either of those elements specifies that the element represents a special value.

As mentioned above, a given anchored-data element when not representing a special value represents a portion of bits corresponding to a given range of significance representable using the anchored-data element. Here the term significance refers to the particular power of two represented by two at a given bit position. For example, a bit of a two's complement number which represents $2^4$ is considered to have greater significance than the bit of the two's complement number which represents $2^3$. That is, the most significant bit of a two's complement number has the highest significance and the least significant bit has the lowest significance.

Particular embodiments will now be described with reference to the figures.

A high-precision anchor (HPA) format is discussed below. More information about the HPA format can be found in the U.S. patent applications 62/074,149, Ser. Nos. 14/582,974, 14/582,875, 14/582,812, 14/582,836, 14/582,978, 14/606, 510, and 14/582,968, the contents of which are entirely incorporated herein by reference.

Floating-Point Numbers

Floating-point (FP) is a useful way of approximating real numbers using a small number of bits. The IEEE 754-2008 FP standard proposes multiple different formats for FP numbers, some of which are binary 64 (also known as double precision, or DP), binary 32 (also known as single precision, or SP), and binary 16 (also known as half precision, or HP). The numbers 64, 32, and 16 refer to the number of bits required for each format.

Representation

FP numbers are quite similar to the "scientific notation" taught in science classes, where instead of negative two million we'd write $-2.0 \times 10^6$. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is always 2.

More precisely, FP numbers consist of a sign bit, some number of biased exponent bits, and some number of fraction bits. In particular, the DP, SP and HP formats consist of the following bits:

TABLE 2

| format    | sign | exponent      | fraction      | exponent bias |
|-----------|------|---------------|---------------|---------------|
| DP [63:0] | 63   | 62:52 (11 bits) | 51:0 (52 bits) | 1023          |
| SP [31:0] | 31   | 30:23 (8 bits)  | 22:0 (23 bits) | 127           |
| HP [15:0] | 15   | 14:10 (5 bits)  | 9:0 (10 bits)  | 15            |

The sign is 1 for negative numbers and 0 for positive numbers. Every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the table above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$-1^{sign} \times 1.\text{fraction} \times 2^e$$

where e is the true exponent computed from the biased exponent. The term 1.fraction is called the significand, and the 1 is not stored as part of the FP number, but is instead inferred from the exponent. All exponents except zero and the maximum exponent indicate a significand of the form 1.fraction. The exponent zero indicates a significand of the form 0.fraction, and a true exponent that is equal to 1-bias for the given format. Such a number is called subnormal (historically these numbers were referred to as denormal, but modern usage prefers the term subnormal).

Numbers with both exponent and fraction equal to zero are zeros.

The following table has some example numbers in HP format. The entries are in binary, with '_' characters added to increase readability. Notice that the subnormal entry (4th line of the table, with zero exponent) produces a different significand than the normal entry in the preceding line.

TABLE 3

| Sign | 5-bit exponent | 10-bit fraction | 11-bit significand | value |
|---|---|---|---|---|
| 0 | 01111 | 00_0000_0000 | 100_0000_0000 | $1.0 \times 2^0$ |
| 1 | 01110 | 10_0000_0000 | 110_0000_0000 | $-1.1 \times 2^{-1}$ |
| 0 | 00001 | 10_0000_0000 | 110_0000_0000 | $1.1 \times 2^{-14}$ |
| 0 | 00000 | 10_0000_0000 | 010_0000_0000 | $0.1 \times 2^{-14}$ |
| 1 | 11111 | 00_0000_0000 | | −infinity |
| 0 | 11111 | 00_1111_0011 | | NaN |

A large part of the complexity of FP implementation is due to subnormals, therefore they are often handled by microcode or software. Some processors handle subnormals in hardware, speeding up these operations by a factor of 10 to 100 compared to a software or microcode implementation.

Integers, Fixed-Point, Floating-Point

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001

−1=1001

In two's complement representation, an (n+1)-bit binary integer represents numeric value $i-S*2^n$, where i is an n-bit integer i is represented by the low order n bits of the n+1-bit value, and S is the bit value (0 or 1) of the most significant bit of the (n+1)-bit value. Hence, unlike for sign-magnitude numbers, where the sign bit modifies the sign of all other bits of the value, for a two's complement value the most significant bit is weighted negatively and all other bits are weighted positively. Hence, a 4-bit two's complement integer would represent plus and minus one as:

+1=0001

−1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that we can still use fixed-point software and data, but we are not limited to fixed-point when writing new software.

Rounding FP Numbers

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned.

There are a number of ways of rounding, called rounding modes; six of these are:

TABLE 4

| mode | | definition |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:

L—(least) the least significant bit of the truncated value
G—(guard) the next most significant bit (i.e. the first bit not included in the truncation)
S—(sticky) the logical OR of all remaining bits that are not part of the truncation Given these three values and the truncated value, we can always compute the correctly rounded value according to the following table:

TABLE 5

| Mode | change to the truncated value |
|---|---|
| RNE | increment if (L&G)|(G&S) |
| RNA | increment if G |
| RZ | none |
| RP | increment if positive & (G|S) |
| RM | increment if negative & (G|S) |
| RX | set L if G|S |

For example, consider multiplying two 4-bit significands, and then rounding to a 4-bit significand.

sig1=1011 (decimal 11)

sig2=0111 (decimal 7)

multiplying yields sig1×sig2=1001_101 (decimal 77)

L_Gss

The least significant bit of the truncated 4-bit result is labelled L, the next bit G, and S is the logical OR of the remaining bits labelled s (i.e. S=0|1=1). To round, we adjust our 4-bit result (1001) according to the rounding mode and the computation in the table above. So for instance in RNA rounding, G is set so we return 1001+1=1010. For RX rounding G|S is true so we set L to 1 (it's already 1, so in this case nothing changes) and return 1001.

Rounding Integer and Fixed-Point Numbers

If we convert an FP number to integer or fixed-point we also round. The concept is basically the same as FP rounding. An FP number that happens to be an integer always rounds to that integer. All other FP numbers lie between two consecutive integers, and rounding dictates which integer is returned. Unfortunately the rounding logic for integers is somewhat harder because of the differences between two's complement and sign-magnitude form. Incrementing a sign-magnitude number always increases the magnitude, so the incremented number is farther away from zero. The same thing happens for positive two's complement numbers, but negative two's complement numbers become closer to zero when incremented. This means that the rounding logic has to change based on whether the integer is positive or negative. It also means we have to be careful in picking the base value (the value which will be incremented or not). For positive integers, that value is just the truncated FP significand, so 1.37 will have a base value of 1, and a result of either 1 or 2. For negative integers, we again truncate the significand and take the one's complement of the result (one's complement is the original number with all bits inverted), −1.37 is truncated to 1 and then inverted, giving a base value of −2. Everything then works out since we want our result to be either −2 or (when incremented) −1.

To further complicate things, our method of conversion requires some computation to find L, G, and S for negative integers. Correct rounding would require us to complete the two's complement process (invert and add 1) and then compute L, G, and S, but adding that 1 is slow compared to just inverting. Ideally we would like to compute the actual L, G, and S from the original shifted input (i.e., from the input before we've done anything about signs. So the floating-point 1.37 or −1.37 would both be right shifted to the integer 1).

Let L0, G0, and S0 be the least significant bit (lsb), guard and sticky before inverting, and let Li, Gi, and Si be lsb, guard and sticky after inverting, and finally let L, G, and S be the lsb, guard and sticky after inverting and adding 1.

If S0 is zero, then the bits contributing to Si are all ones, and hence S (obtained by adding 1 to those Si bits) is also zero. If S0 is nonzero, then Si is not all ones, and hence S is nonzero. So in all cases S0=S.

If G0 is zero, then Gi is 1, and G is also one except for the case when there is a carry-in from the S bits, which only happens when S0 is zero. If G0 is 1, then Gi is zero, and again G is also one except for the case where there is a carry-in from the S bits, which only happens when S0 is zero. So G=G0^S0.

By very similar logic, L=L0^(G0|S0).

Now that we have L, G, and S for both negative and positive integers, we can come up with our rounding rules:

TABLE 6

| Mode | change to a positive value | change to a negative value |
| --- | --- | --- |
| RNE | increment if (L&G)|(G&S) | increment if (L&G)|(G&S) |
| RNA | increment if G | increment if (G&S) |
| RZ | none | increment if (G|S) |
| RP | increment if (G|S) | increment if (G|S) |
| RM | none | none |
| RX | set L if G|S | set L if G|S |

Fixed-point numbers round exactly the same way as integers. The rules for unsigned conversions (to integer or fixed-point) are the same as the rules for positive conversions.

Injection Rounding

A faster way to do rounding is to inject a rounding constant as part of the significand addition that is part of almost every FP operation. To see how this works, consider adding numbers in dollars and cents and then rounding to dollars. If we add $1.27
+ $2.35
$3.62

We see that the sum $3.62 is closer to $4 than to $3, so either of the round-to-nearest modes should return $4. If we represented the numbers in binary, we could achieve the same result using the L, G, S method from the last section. But suppose we just add fifty cents and then truncate the result?

1.27
+ 2.35
+ 0.50   (rounding injection)
4.12

If we just returned the dollar amount ($4) from our sum ($4.12), then we have correctly rounded using RNA rounding mode. If we added $0.99 instead of $0.50, then we would correctly round using RP rounding. RNE is slightly more complicated: we add $0.50, truncate, and then look at the remaining cents. If the cents remaining are nonzero, then the truncated result is correct. If there are zero cents remaining, then we were exactly in between two dollar amounts before the injection, so we pick the even dollar amount. For binary FP this amounts to setting the least significant bit of the dollar amount to zero.

Adding three numbers is only slightly slower than adding two numbers, so we get the rounded result much more quickly by using injection rounding than if we added two significands, examined L, G, and S, and then incremented our result according to the rounding mode.

Implementing Injection Rounding

For FP, the rounding injection is one of three different values, values which depend on the rounding mode and (sometimes) the sign of the result.

Both RNA and RNE require us to inject a 1 at the G position (this is like adding $0.50 in our dollars and cents example).

RP and RM rounding depends on the sign as well as the mode. RP rounds positive results up (increases the magnitude of the significand towards positive infinity), but truncates negative results (picking the significand that is closer to positive infinity). Similarly RM rounds negative results up (increasing the magnitude of the significand toward negative infinity), but truncates positive results (picking the significand that is closer to negative infinity). Thus we split RM and RP into two cases: round up (RU) when the sign matches the rounding direction, and truncation (RZ) when the sign differs from the rounding injection. For RU cases we inject a 1 at the G-bit location and at every location that contributes logically to S (this is like adding $0.99 in our dollars and cents example).

For RZ and RX modes, and for RP and RM modes that reduce to RZ mode, we inject zeros.

For most of the rounding modes, adding the rounding injection and then truncating gives the correctly rounded result. The two exceptions are RNE and RX, which require us to examine G and S after the addition. For RNE, we set L to 0 if G and S are both zero. For RX we set L to 1 if G or S are nonzero.

FP Numbers are not Real Numbers

It's tempting to think of FP numbers as being just like real numbers, but they are fundamentally different, even for the most basic properties:

They are not associative. For example, in SP we can add 3 numbers and return 1 million or zero, perhaps not what people think of as a rounding error:

$(2^{45}+-2^{45})+2^{20}=2^{20}$ $2^{45}+(-2^{45}+2^{20})=0$

They don't obey the distributive laws. Again in SP:

$3,000,001*(4.00001+5.00001)=0\text{x}4\text{bcdfe}83$ $(3,000,001*4.00001)+(3,000,001*5.00001)=0\text{x}4\text{bcdfe}82$ and things get even worse in the presence of overflow:

$2^{50}*(2^{78}-2^{77})=2^{127}$ $(2^{50}*2^{78})-(2^{50}*2^{77})=\text{infinity}$ For some implementations, they aren't even commutative unless we are in default NaN mode (a mode that converts all NaNs to a single NaN), because in general nanA+nanB !=nanB+nanA. Numeric adds and multiplies are commutative.

Because of IEEE NaN rules, there are no multiplicative or additive identities. One and zero work as identities for numeric values.

One useful way to think of FP numbers is to consider them to be very long fixed-point numbers in which at most a few (53 for DP) consecutive bits can be nonzero. For example, non-infinite DP numbers can have the first bit of the significand in any of 2046 places, and that first bit is followed by 52 other significant bits, and there is a sign bit, so any finite DP number can be represented as a 2046+52+1=2099-bit fixed point number. Examined this way it becomes very obvious that adding two FP numbers does not, in general, result in another FP number: the result of the addition has to be rounded so that it becomes an FP number.

A known issue with floating-point (FP) arithmetic is that it is non-associative, a fact that makes sums problematic:
  programmers need to worry about wildly different results, even when adding 3 numbers
  programmers use wider formats than they need, in the hope of avoiding the wildly different results
  programmers can't easily parallelize code, because sums aren't reproducible unless computed in the exact same order.

For example, in single precision, $2^{20}+(-2^{44}+2^{44})=2^{20}$ but $(2^{20}+-2^{44})+2^{44}=0$ Depending upon the order the operations are performed, the result is one million or zero. This is an extreme example because the exponents differ by 24, but we can get different answers if the exponents differ by 1, or even if all of the exponents are the same and we are adding more than 3 things. The C programming language addresses the reproducibility problem by requiring sums to be evaluated left-to-right, in order, but this does nothing for correctness, and makes parallelization impossible.

The problems are especially acute for high-performance computing (HPC), where programs may need to add millions of things. Programmers would like to parallelize these problems, but then the lack of reproducibility makes debugging even harder than it usually is. Different configurations of machines will produce different answers even if the reprogramming for those machines is done perfectly.

HPA Representation (Anchored-Data Values)

A new datatype has been proposed that allows fast and correct accumulation of floating-point (FP) numbers in a programmer-selectable range. For the modest ranges that will accommodate most problems, the accumulation is faster than FP addition, and is associative. Associative addition allows the problems to be parallelized while still giving reproducible and correct results, enabling speedups by, for example, a factor of 100 or more as compared to existing hardware. We believe these benefits will be irresistible in the high-performance computing (HPC) space, and compelling for many non-HPC applications.

FIG. 1 schematically illustrates a data processing apparatus 2 for performing data processing operations under control of program instructions. A data processing apparatus 2 comprises a memory 4 storing program instructions 6 and data 8 to be processed. A processor core 10 is coupled to the memory 4 and includes a register bank 12, processing circuitry 14, an instruction fetch unit 16, an instruction pipeline unit 18 and an instruction decoder 20. It will be appreciated that in practice the data processing system 2 may include many additional elements and that the representation of FIG. 1 is simplified to aid understanding. In operation, program instructions 6 are fetched from the memory 4 by the instruction fetch unit 16 and supplied to the instruction pipeline 18. When the program instructions reach the appropriate stage within the instruction pipeline 18 they are decoded by the instruction decoder 20 and generate control signals which serve to control the operation of the register bank 12 and the processing circuitry 14 to perform the processing operation(s) specified by the program instruction decoded. Multiple input operands may be read from the register bank 12 and supplied to the processing circuitry 14 where they are manipulated and then a result value written back into the register bank 12.

The register bank 12 can have a variety of different forms. The operands to be manipulated may, for example, include floating-point operands, fixed point operands, integer operands and HPA or RHPA number operands (as will be described later). The register bank 12 may serve to store a mixture of these types of operands depending upon the configuration of the register bank 12. The operands can have differing levels of precision, as may be predefined by their format, or as may be programmably specified using metadata associated with the registers as will be described later in relation to the HPA number operands.

As shown in FIG. 1, the register bank 12 may include metadata registers 22 for specifying metadata associated with an HPA or RHPA value stored in a corresponding data register of the register bank 12 (examples of the contents of the metadata are given below). In some cases, each data register may have corresponding metadata registers 22, while in other cases two or more data registers may share metadata specified by a single metadata register 22.

Figure 2:
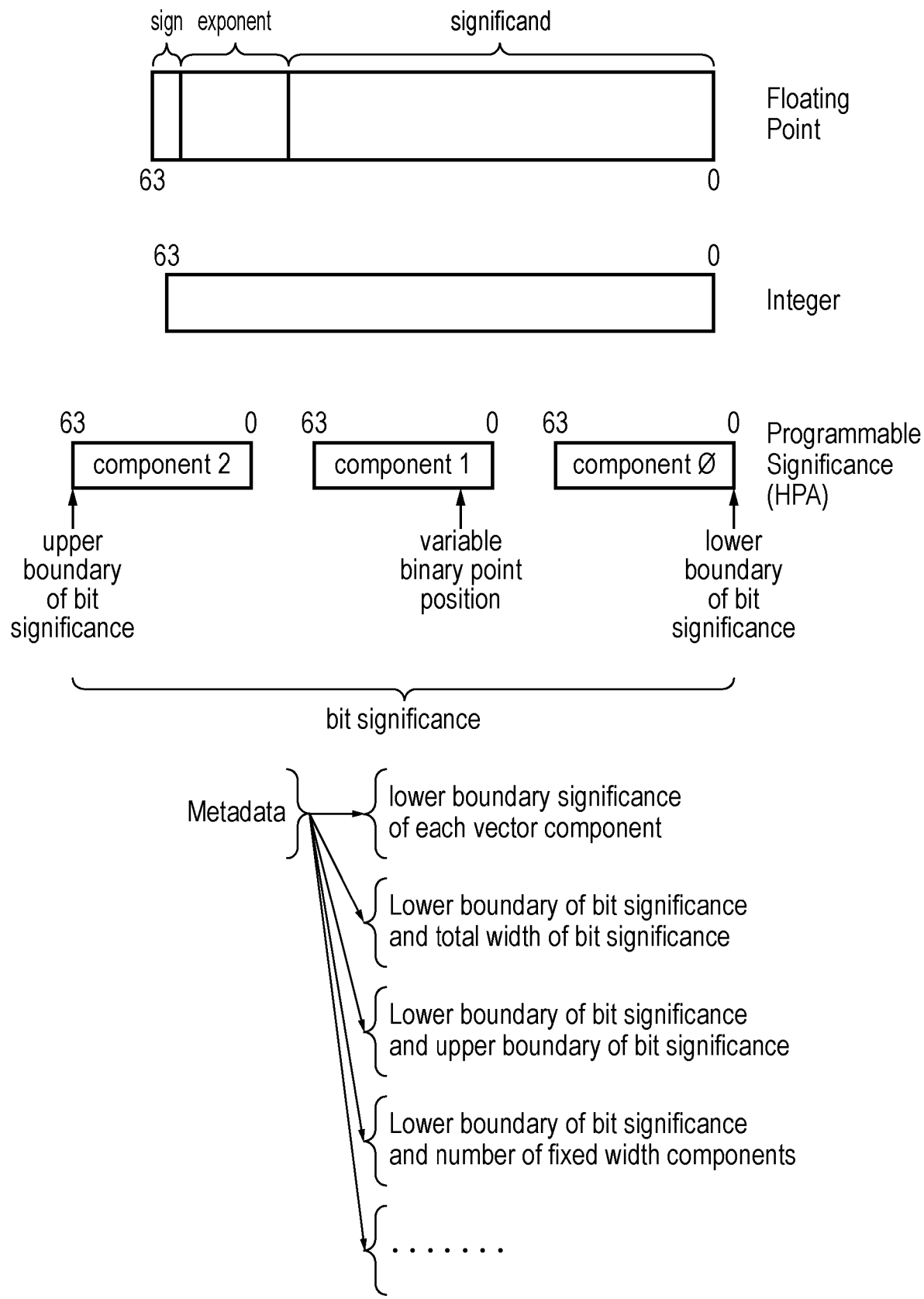
FIG. 2 schematically illustrates different representations of numeric values.

FIG. 2 schematically illustrates a floating-point operand. A floating-point operand is formed of a sign, an exponent and a significand. Floating-point operands can represent values with a wide variety of magnitudes indicated by their exponent values. The precision with which a number can be represented is limited by the size of the significand. Floating-point operations typically are more complex and slower to implement than integer arithmetic.

FIG. 2 also illustrates a 64-bit integer operand. Such an integer operand can represent numbers in the range 0 to ($2^{64}$-1) for unsigned integers, or $-2^{63}$ to $2^{63}$-1 for signed integers. Integer arithmetic is typically quick and consumes comparatively little energy to perform (compared to floating-point arithmetic), but suffers from the disadvantage that numbers of a comparatively limited range of values may be specified compared to the range of numbers which may be represented by a floating-point value.

FIG. 2 also illustrates an HPA (high-precision anchor) number comprising a vector of multiple components (in this example three) each comprising a 64-bit integer in this example. The HPA number has metadata associated with it. The metadata includes an anchor value indicating a significance of the bits of the components forming part of the HPA number. The anchor value(s) specifies directly, or indirectly, a lower boundary of the bit significance and an upper boundary of the bit significance. The term metadata used below can be considered to correspond to data including the anchor value(s) that specify the bit significance of an HPA number. The different components together specify the bit values which contiguously span this range of bit significance. Depending upon the position of the lower boundary of the bit significance and the upper boundary of the bit significance, the range of bit significance may include the binary point position. It is also possible that the binary point position may lie outside of the range of bit significance specified for a particular HPA value.

The anchor value(s) may be provided so that they are capable of representing a range of bit significance extending from a smallest significance that can be represented by a floating-point value (e.g. a double precision FP value) up to a highest bit significance that can be represented by that floating-point value.

The number of components which form the HPA number can vary between different implementations. The size of the components may be fixed in some embodiments, but in other embodiments may vary. The overall width of the range bit significance may in some embodiments be constrained to change in units of a fixed component size (e.g. with 64-bit components, the range of the bit significance may have a width of, for example, 64, 128, 192, 256, . . . ). It is also possible that the width of the range of bit significance could vary continuously in steps of one bit width.

The anchor value(s) (within the metadata) may be programmable, so that the programmer can set the significance of the corresponding HPA value. The anchor value may specify the bit significance in a variety of different ways. One example is to specify the lower boundary bit significance of each vector component. Thus, each vector component may comprise an integer value representing its portion of the significant bits of the value within the overall range of bit significance together with metadata representing (anchoring) the significance of the lowest bit within that component. Another option is that the anchor value(s) specifies the lower boundary of the bit significance of the whole HPA number together with the total width of the range of bit significance. A further option is that the anchor value(s) may comprise data specifying the lower boundary and the upper boundary of the range of bit significance. Still further variations are also possible, such as anchor value(s) comprising the lower boundary of the range of bit significance together with the number of the components where those components are known to be fixed width components.

Figure 3:
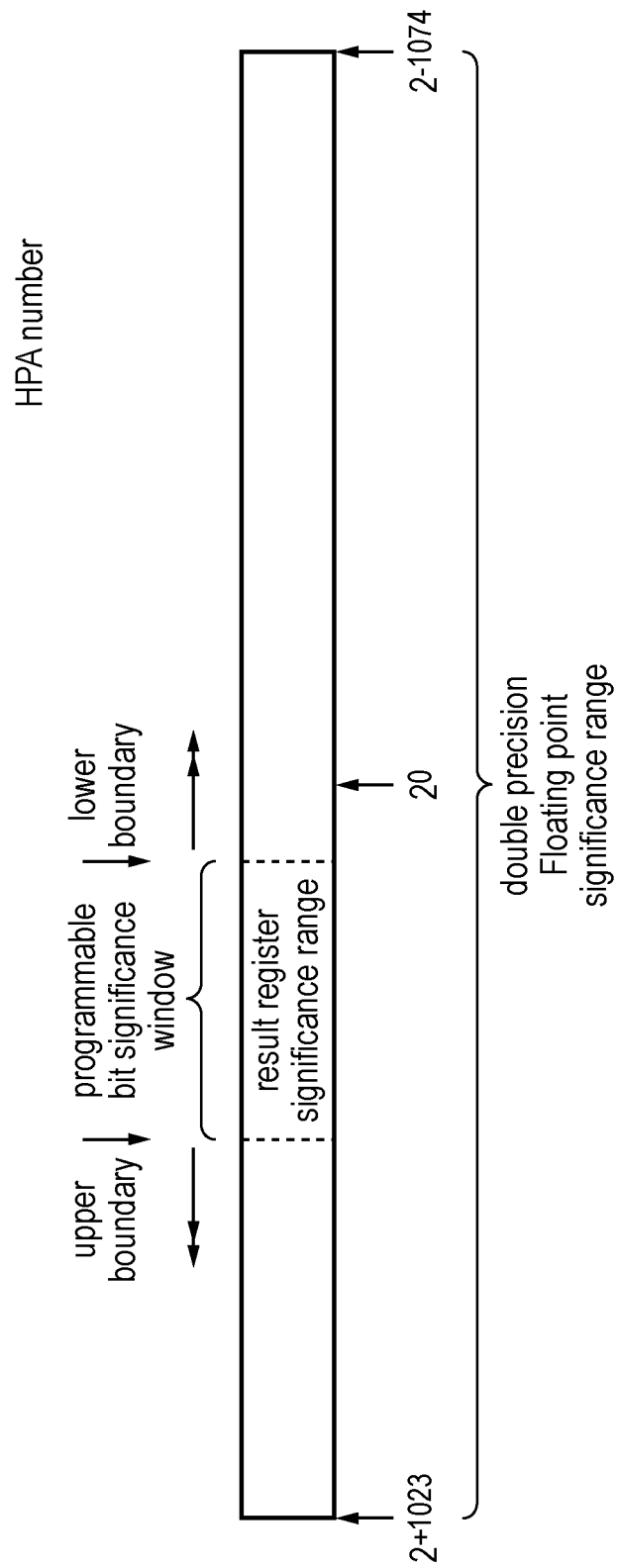
FIG. 3 schematically illustrates an example of a relationship between a double precision floating-point value and a high-precision anchor (HPA) value.

FIG. 3 schematically illustrates a relationship between the range of values representable with a double precision floating-point and the significance range of an HPA number. In the case of a double precision floating-point number, the range of bit values which may be specified extends from approximately $2^{-1074}$ to $2^{+1023}$ (not counting subnormals).

As illustrated, the HPA number has a programmable bit significance range which may be considered as a window of bit significance within the range of bit significance representable using the floating-point value. This programmable bit significance may be specified by a lower boundary and an upper boundary, and depending upon the values of the lower boundary and the upper boundary, may be considered to slide along the range of bit significance provided by the floating-point value. The width of the window, as well as its starting point and ending points, may be specified by appropriate values of the programmable metadata (that includes the anchor value(s)) which specifies the bit significance. Thus the HPA number may have a form selected by the programmer to match the computation to be performed.

The HPA format allows additions of two or more values to be performed fast, exactly and associatively, while still permitting values over a broad range of significance to be represented. Since the HPA value is simply a two's complement number it can be added using an integer adder and there is no need for rounding or normalisation as with floating-point arithmetic, which allows a series of additions to be parallelized because the result will be the same regardless of the order in which the values are added. Nevertheless, by defining metadata specifying a programmable significance of the HPA value, then the full range of significance of an equivalent floating-point value can still be represented, but without needing to provide a very wide adder (e.g. to add two 2's complement numbers across the full range representable by double precision floating-point values would require a 2098-bit adder), and instead the programmable significance enables a smaller adder to focus on a particular window of programmable bit significance within the larger range. In practice, most calculations do not require the entire range of significance available for double precision floating-point. For example, sub-atomic problems might accumulate very small values and astronomic complications might accumulate very large values, but it is not generally useful to add the width of a proton to the distance between galaxies. Even for high-performance computing, most accumulations happen over a limited range.

Typically, the programmer writing a program will know the expected range of values in which useful results are likely to fall (depending on the application). The programmer might determine that all of the data for a particular sum will have a magnitude less than $2^{60}$ and that values with magnitude below $2^{-50}$ will not affect the sum in any meaningful way, and so in this case by adding the data using the HPA format with an overall data width of 128 bits and the anchor value specifying the significance of the least significant bit as −50, the numbers for this particular application can be added associatively in any order.

Hence, by using the anchor value to limit the significant range for which the result is being calculated, a relatively small piece of hardware can be used to calculate the result within the programmably defined window. If an addition results in overflow above the upper significance boundary or underflow below the lower significance boundary of the defined range, then an exception can be raised and this can signal that the programmer has defined the wrong significance boundaries and that the processing should be repeated with different metadata (e.g. a different anchor value or a different overall size of the HPA value) to define a different window of significance for the result.

When adding or subtracting two HPA values, the anchor value is the same for both HPA values and the result also has the same anchor value—this is unlike floating-point arithmetic where the addition or subtraction of two values can lead to a result with a different exponent to either of the inputs due to normalisation of the result. If the inputs are provided with different anchor metadata then they are shifted to align themselves with the required target significance range for the result. If the inputs are provided in a representation other than HPA (e.g. integer or floating-point), then they are converted into HPA values sharing the same anchor value, and added to form a result having the same anchor value. Hence, the metadata for an HPA register can be viewed as defining a target range of significance for the result value to be generated in that register, and bits outside the target range of significance will not be calculated by the hardware regardless of the actual significance of the input values.

RHPA Representation

While the HPA format enables much faster additions compared to floating-point, when the size of an HPA value becomes relatively large then adding two HPA values with integer arithmetic may still be relatively slow. For example, the HPA format may require addition of operands spanning multiple lanes, which may be undesirable in larger vector implementations. For example, addition of two 256-bit or 512-bit values may take some time because each 64-bit lane of addition may be performed sequentially to accommodate carries from one lane being input to the following lane.

Figure 4:
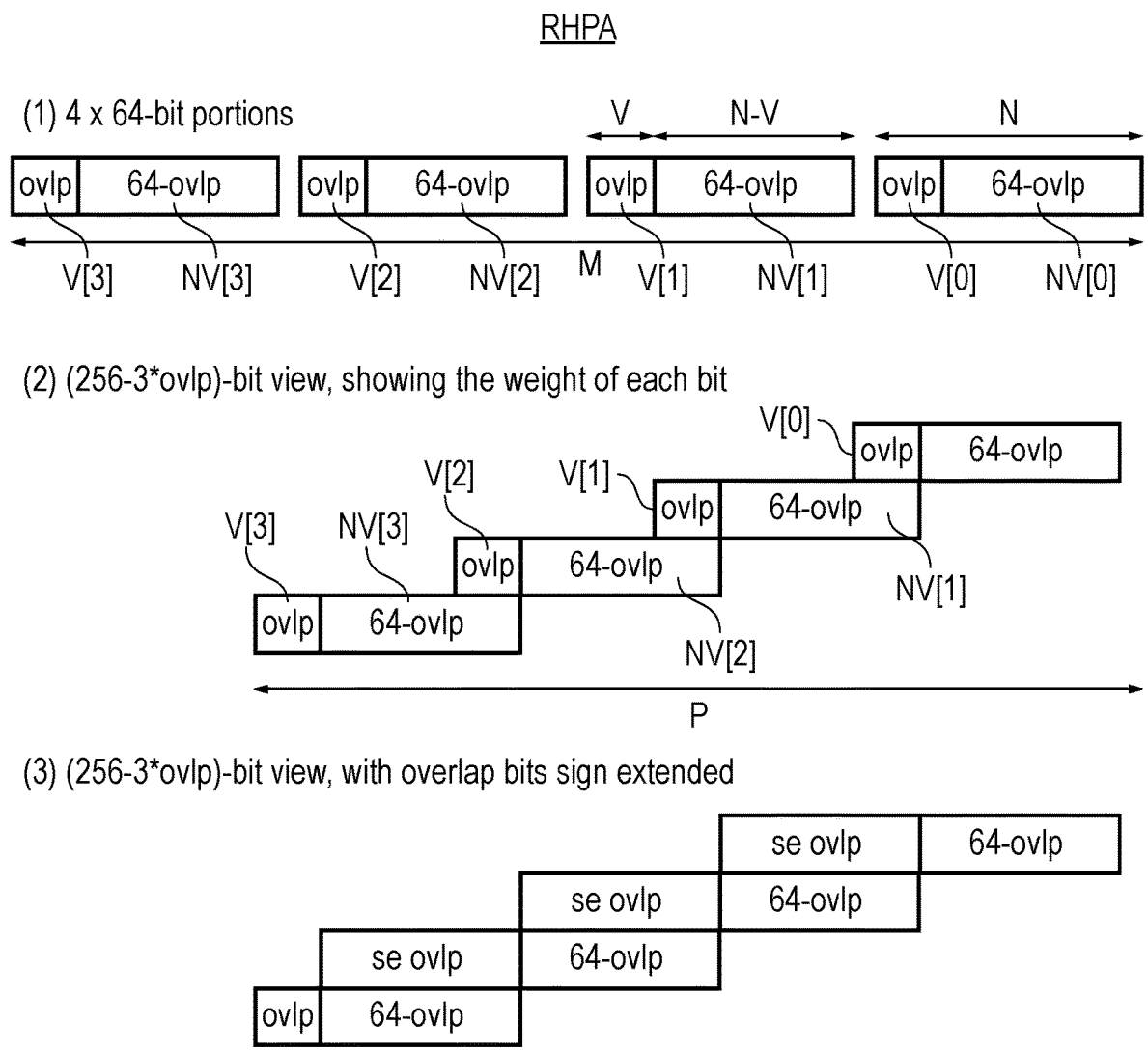
FIG. 4 shows an example of a Redundant HPA value, which represents a numeric value using a redundant representation including a number of N-bit portions with overlapping significance.

The addition can be performed faster by using the Redundant High-Precision Anchor (RHPA) format shown in FIG. 4. As in the HPA format, the RHPA number includes a variable number of components with metadata defining an anchor value which enables the processing circuitry 14 to identify the significance of bits of each component. Again, the anchor value may be programmable. For RHPA, the metadata may identify the significance of each component in any of the ways described above for HPA. However, in the RHPA format, the numeric value is represented using a redundant representation where adjacent lanes of the vector include bits of overlapping significance, which allows constant-time addition regardless of the number of lanes being calculated. The redundancy enables operations such as addition, accumulation and multiplication to be carried out with shorter adders and without propagating carry information between adders. This greatly speeds up processing of data values.

As shown in part (1) of FIG. 4, an M-bit data value using the RHPA representation is divided into respective vector lanes (also referred to as components, elements or portions) each comprising N bits, where N<M. In this example N is 64 bits, but this is just one example and other lane sizes (e.g. 32 or 128 bits) are also possible. Each N-bit portion is divided into a certain number V of overlap bits and N-V non-overlap bits. In this example, the number of overlap bits V is the same for each N-bit portion, but it is also possible to have different N-bit portions with different numbers of overlap bits.

When an integer or floating-point number is converted to RHPA format, some of the non-overlap bits are populated with non-sign information mapped from the original integer or floating-point number, while the overlap bits are populated with sign bits. For lane-based addition and subtraction purposes each lane behaves like an N-bit signed two's complement number (with carries propagating from the non-overlap portion to the overlap portion if necessary), but when viewed from a multilane perspective the lanes form a redundant mixed-sign representation of a larger P-bit number. In the example of FIG. 4 there are four lanes and so M=256, but the number of lanes can vary depending on the hardware implementation and/or the metadata defined for a given RHPA number.

Part (2) of FIG. 4 shows the relative significance of each bit of the RHPA number shown in part (1). The overlap bits V[0] of the least significant lane have the same significance as the V least significant bits of the non-overlap bits NV[1] of the next lane. Likewise overlap bits V[1] and V[2] have the same significance as the V least significant bits of non-overlap bits NV[2] and NV[3] respectively. The overlap in significance between lanes means that the RHPA number as a whole represents a P-bit value which is smaller than the total number of stored bits M. If V is the same for each N-bit portion (other than the top portion), then $$P = M - V\left(\frac{M}{N} - 1\right).$$

More generally, if different lanes can have different numbers of overlap bits, $P = M - \Sigma V$, where $\Sigma V$ is the total of the number of overlap bits in each lane other than the top lane.

In each overlapping portion of the P-bit value, the actual bit values of that P bit number are represented by the sum of the overlap bits V of the lower lane and the non-overlap bits NV in the higher lane (taking into account any carries that may be caused by adding the non-overlap bits NV and the overlap bits in lower lanes). Hence, one way of converting the RHPA value to an equivalent integer value is shown in part (3) of FIG. 4, where the overlap bits in each lane are sign-extended and added to the non-overlap bits of the higher lane (from low order to high order, adjusting the overlap bits after each lane addition).

The RHPA number is redundant in the sense that there is more than one way to represent a given P-bit number using the M bits of the RHPA value. For example considering the overlap in the lowest two lanes, in an example where the number of overlap bits V=4, if the corresponding bits of the P-bit value are 1111, then one way to represent this would be to have the overlap bits V[0]=0b0000 in the lower lane and the non-overlap bits NV[1]=0b1111 in the next highest lane. However, other ways of representing the same values could be V[0]=0b0101 and NV[1]=0b1010, or v[0]=0b1111 and NV[1]=0b0000, say.

Note that the overlap bits V[3] in the highest lane are not really overlap bits because there is no higher order lane to overlap with. Hence, it can often be useful to consider the high order lane as having all non-overlap bits. Hence, in some cases the top lane may be considered to be formed entirely of non-overlap bits (so that the most significant bit of the P-bit value as a whole corresponds to the most significant bit of the M-bit value in the top lane).

However, in other embodiments, it may be preferable to treat the top lane as having overlap bits too, so that the most significant bit of the P-bit numeric value represented by the RHPA corresponds to the most significant bit of the non-overlap portion (excluding the overlap portion) of the top lane. This approach may make circuit implementation easier if it allows each lane to be processed in a more symmetric manner (with fewer modifications to the way the top lane is processed compared to other lanes).

By representing a P-bit numeric value in a redundant form as shown in FIG. 4, several RHPA numbers can be added without carries between lanes, because any carries from additions of the non-overlap portions in a given lane can be accommodated within the overlap portion of the same lane, without needing to propagate carries through to the next lane. The addition performed in each lane simply sees two or more N-bit signed integers which are added by performing a conventional N-bit two's complement addition, which is entirely independent of the corresponding N-bit additions in other lanes. This means that each of the N-bit additions can be performed in parallel, so that regardless of the number of lanes, the entire M-bit values can be added in the time taken to perform a N-bit addition.

In fact, at least $(2^{V-1}-1)$ such RHPA numbers can be added without carries between lanes, with any carries from the addition of non-overlap portions being collected in the overlap portion (if there are lanes having different numbers of overlap bits, then V in this expression would be the minimum number of overlap bits in any given lane having overlap bits). The $(2^{V-1})$th addition would be the first that could possibly generate a carry between lanes (because the top overlap bit is a sign bit, lane overflow occurs when there is a positive or negative overflow from the second most significant overlap bit, which when starting from an RHPA number where all the bits are 0 can occur after a minimum of $2^{V-1}$ further additions have been performed). For example, if V=14, this would allow at least 8191 RHPA numbers to be added to the accumulator (i.e. 8192 values added in total) before there is any risk of overflow from a single lane. This is particularly useful for the high performance computing field where addition of many input values is common. In practice, as not every addition will cause a carry into the overflow portion, sometimes more than $2^{V-1}$ accumulations are possible without overflow from the top bit of the N-bit portion.

Occasionally, if enough additions have been performed to cause a risk of overflow (or an actual overflow) from the top bit of an N-bit lane, then an overlap reduction operation can be performed to convert a given RHPA value to a second RHPA value in which the overlap bits represent a smaller magnitude than the overlap bits of the given RHPA value, to effectively free up bit space in the overlap portions for accommodating more carries. Also, when converting an RHPA number back to another format such as integer or floating-point, such overlap reduction may also be performed. However, in practice, such an overlap reduction operation may not be required often, and so by allowing M-bit additions of multiple inputs to be performed in the time taken for an N-bit addition, RHPA enables a great saving in processing time. Note that the term "overlap reduction" does not imply that the overlap bits in every lane must be reduced to a smaller magnitude. It is enough that at least one lane has its overlap bits reduced in magnitude, and it is possible that some forms of overlap reduction could lead to overlap bits in a given lane increasing in magnitude.

Efficient Storage and Manipulation of HPA Numbers

For the following description, it will be assumed that the HPA form used is the above discussed RHPA form where each portion includes a number of overlap bits, but the techniques described herein are equally applicable to other HPA forms, for example HPA forms where the different portions do not include overlap bits. Hereafter, the term HPA will be used to refer to the HPA values being manipulated, irrespective of whether they are in redundant form or not.

As will be apparent from the earlier discussed FIG. 4, the different HPA portions (anchored-data elements) of an HPA number (anchored-data value) may be located within different lanes of a single vector register. However, this gives rise to a number of potential issues. For example, when creating the HPA form from a floating-point operand, the fraction of the floating-point operand needs to be propagated to all of the lanes within the relevant vector register, along with a desired anchor value. Each lane will then have a different lane anchor based on the anchor value. Further, it can result in wasteful use of the vector register resource, in situations where the vector registers are significantly larger than the long integer value of the HPA number, for example where a 1024-bit register holds a 200-bit long integer of an HPA number. Further, processing can be problematic if a vector register has an insufficient number of bits to represent all of the portions of the long integer of the HPA number, for example if the vector register is 128 bits wide and a 200-bit long integer of an HPA number needs to be represented.

In the examples discussed hereafter, an alternative storage arrangement is provided for the various portions of an HPA number. In particular, the long integer of an HPA number is arranged so as to be stored within a common lane across multiple vector registers, as illustrated schematically in FIG. 5A. In particular, a set of vector registers 100 are provided, where each vector register can be considered to consist of a plurality of sections for storing data values. Further, a plurality of lanes can be considered as extending through the vector registers (in a vertical direction in the orientation illustrated in FIG. 5A), the first four lanes being denoted by the reference numerals 102, 104, 106, 108 in FIG. 5A. The long integer of an HPA number can then be stored within a common lane by storing different portions of the HPA integer value in different vector registers. This is illustrated schematically for the example HPA integer 110, which is considered to consist of four portions, one portion being stored in each of the vector registers Z0, Z1, Z2 and Z3. Further, all of the portions are stored within the common lane 102. By storing the integer of the HPA number in this way, this gives rise to a number of significant benefits. For example, the size of the integer is not constrained by the width of an individual vector register. Further, inefficient utilization of the vector registers can be avoided, since multiple HPA integers can be stored in different lanes across the various vector registers, with those integer values then being able to be operated on in parallel in a SIMD fashion. For example, considering FIG. 5A, if each of the vector registers shown in FIG. 5A were to provide 16 lanes, then 16 HPA numbers can be stored within the four vector registers Z0 to Z3, each HPA number occupying a different lane. Hence, it can be seen that this approach significantly improves scalability and provides a technique which is vector length agnostic. This hence allows the technique to be adopted in a wide variety of different systems, each of which may operate using different sized vector registers. There are hence many applications where the use of such a storage technique for the HPA values will give rise to significant performance benefits, but one example is in association with systems adopting the Scalable Vector Extension (SVE) proposed by Arm Limited.

Arm Limited has announced the Scalable Vector Extension (SVE) to its 64-bit ISA, targeted at scientific HPC applications. While SVE does not currently include HPA support, it is continuing to evolve, and a few modest additions to its instruction set would enable very high HPA performance. The "scalable" part of SVE refers to it not requiring the same vector length for all implementations: SVE vectors can be implemented in hardware as any multiple of pairs of 64-bit lanes, from 128 to 2048 bits. A small chip might only implement 128-bit vectors, while a supercomputer might implement 1024 or even 2048-bit vectors. Holding a 200-bit integer within a single SVE register would be impossible on a 128-bit implementation, and wasteful on a 2048-bit implementation, but holding some number of 200-bit integers spread across 4 of these registers takes full advantage of the scalability of SVE, and works well on any hardware implementation, from small to large. It also frees the programmer to use shorter or longer integers as required: 100-bit integers could fit in corresponding lanes of 2 vector registers, and 500-bit integers could fit in corresponding lanes of 10 vector registers.

For performance and area reasons, SVE performs arithmetic within 64-bit lanes. We propose doing HPA addition by breaking large i HPA numbers into smaller redundant pieces. Each 64-bit lane will hold a specified part of i (say p=50 bits, but this can be programmable), with the remaining 64-p bits used to keep carries within a lane. These remaining bits are referred to as "overlap" bits because they have the same numerical weight as the lsb's of the next most significant lane. The addition within a lane is just a normal 64-bit integer addition. Every $2^{64-p}$ cycles, (i.e. every 16,000 cycles or so for p=50), a redundancy elimination step may be required to prevent lane overflow, and at the end of every computation a lane-by-lane process will be required to obtain a non-redundant answer.

In order to convert an FP input f, to an HPA number format (i, a), each 64-bit lane examines the exponent off compares it to the anchor a, and then determines if any part of the significand off should be added to the portion of i under consideration. This comparison may be done in parallel across all applicable lanes. While the significand off might span two portions (or three portions for FP64 products, depending on the value of p), each portion can be created and manipulated independently.

An example conversion of an FP32 number into a two portion HPA with a chosen to be 0 and p chosen to be 50 is set out below. In this example, the FP32 number is assumed to occupy the "right-hand" 32 least significant bits of a vector register lane, and HPA numbers are assumed to occupy 64-bit register lanes (including a 50-bit value and 14 overlap bits). If the FP number is:

$f$=+1.0110 1011 1010 0010 1111 011×$2^{60}$ $FP$32 significand, $f$[23:0]=1 0110 1011 1010 0010 1111 011

Portion 1 of the HPA number will have an adjusted portion anchor=50 and is computed as follows:

$i$[1]=$f$[23:0] left shifted by (exponent−23)−portion anchor=37−50=−13 places (−ve left shift is +ve right shift->$i$[1]={14 0's},{39 0's},$f$[23:13]=1 0110 1011 10})

(the adjustment of the exponent by 23 takes account of the fact that the exponent of a floating-point value represents the significance of the implied decimal point to the left of the most significant bit of the 23-bit fraction, whereas the anchor represents the significance of the least significant bit of the fraction).

The Portion 0 of the HPA number will have an adjusted portion anchor=0 and is computed as follows:

$i$[0]=$f$[23:0] left shifted by (exponent−23)−portion anchor=37−0=37 places->$i$[1]={{14 0's},$f$[12:0]=10 0010 1111 011,{37 0's}}

Figure 5A:
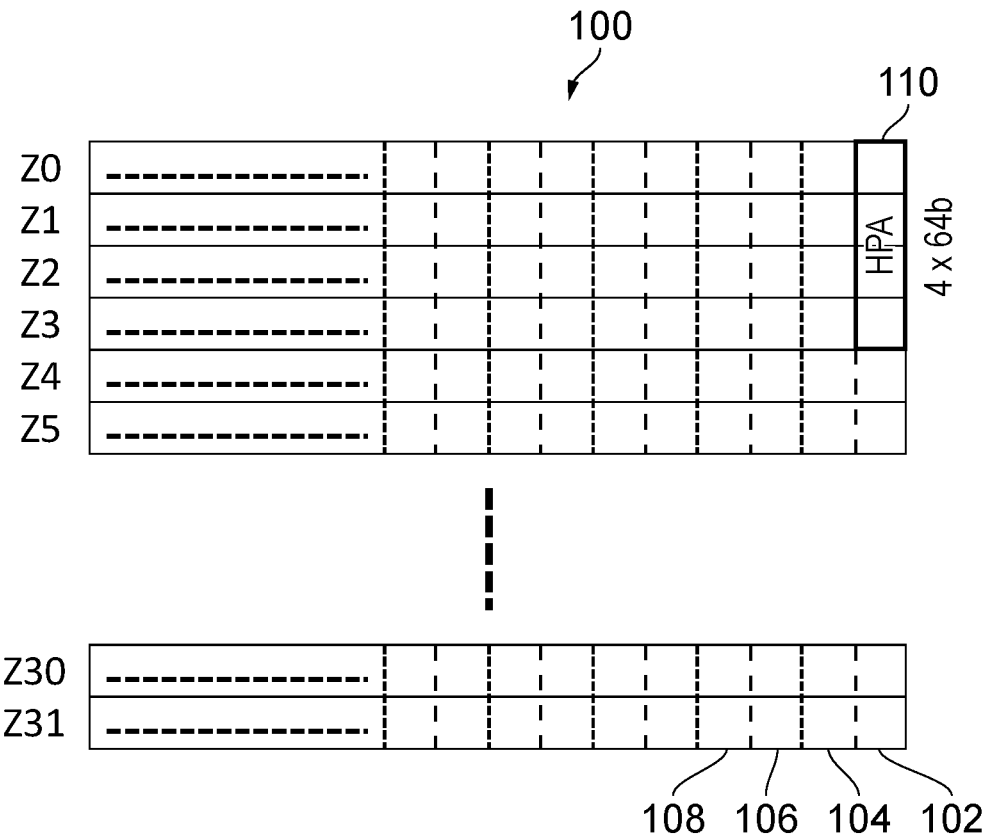
FIG. 5A schematically illustrates how an HPA integer may be stored within a selected lane across multiple vector registers, in one example.
Figure 5B:
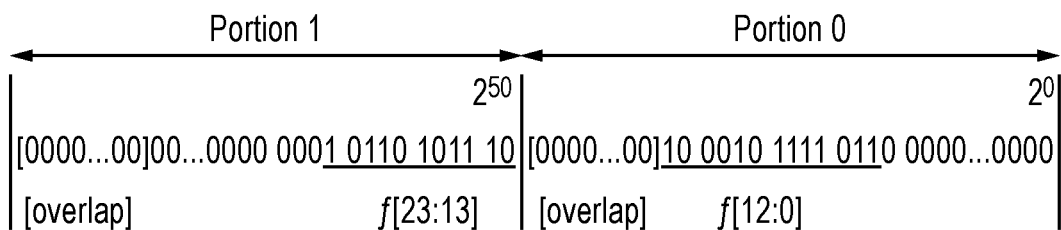
FIG. 5B shows an example of HPA form.

This results in the HPA form as shown in FIG. 5B.

Generally speaking, correctly rounding an HPA result to a single FP result has to be a sequential process, requiring lane-by-lane propagation of carry and rounding information. It would require several cycles, but only has to happen once for each accumulation. Alternatively, if p≤53, a non-redundant HPA number occupying several 64-bit lanes could be converted in parallel to a vector of FP64 numbers. The resulting vector should then be "renormalized" so that the most significant element represents the full HPA number to an accuracy of 0.5 ulp.

Having now described the fundamentals of HPA processing at a high level, we now describe in greater detail how an HPA accumulator might be implemented in SVE.

SVE supports vector register lengths of k×128 bits up to a current maximum of 2048 bits (i.e. 1≤k≤16) and is based on the concept of "Vector-Length Agnostic" (VLA) processing, whereby different CPUs with different SVE vector register lengths can all run the same SVE program. An SVE program reads the available vector length from a system register and "self-adjusts" to exploit the available vector register length. Consequently, SVE programs execute within 128-bit granules with the CPU processing as many granules in parallel as the available vector hardware length can support.

As mentioned earlier with reference to FIG. 5A, to achieve vector-length agnosticism, HPA numbers may be laid out across multiple SVE registers. Each register may hold bits of the same significance of different HPA numbers: that is, each register is associated with a significance that gives the value of the number's anchor adjusted relative to each portion's position in an HPA number.

Returning to the earlier example of a 200-bit HPA number with p=50 bits held in each portion, if the anchor of the HPA number is −80, the significance information for the four portions would be (+70, +20, −30, −80) with 14 overlapping bits per 64-bit portion. Note that there is no need for the individual portions of the HPA number to be stored in contiguous registers as per the example in FIG. 5A.

The primary advantage of laying out HPA numbers in this way is that they (or long integers) can be dealt with in SIMD fashion, even across SIMD implementations (e.g. 128-bit vectors) that may be shorter than the long HPA numbers. A secondary advantage is that longer SIMD implementations (e.g. 1024 bit vectors) are not wasted by storing much shorter HPA numbers within each vector. Provided that there are sufficiently many integers or HPA numbers, the vectors are fully utilized regardless of the SVE implementation length.

Laying out HPA numbers across several registers also allows HPA arithmetic to be highly parallelized with vectors of FP numbers being accumulated within their own 64-bit lanes. In addition, loading large quantities of FP numbers from memory reduces to simple and efficient contiguous vector loads. Finally, this layout of HPA numbers allows existing SVE instructions to be used to perform important HPA computations (such as eliminating redundancy or adding HPA numbers together) because a number of HPA integers can all be processed in parallel from low-order bits to the high-order bits. The scheme also speeds up the conversion and renormalization of HPA numbers to FP, again because multiple HPA numbers can all be processed simultaneously from high-order lanes to lower-order lanes, or low-order lanes to high-order lanes.

Figure 6:
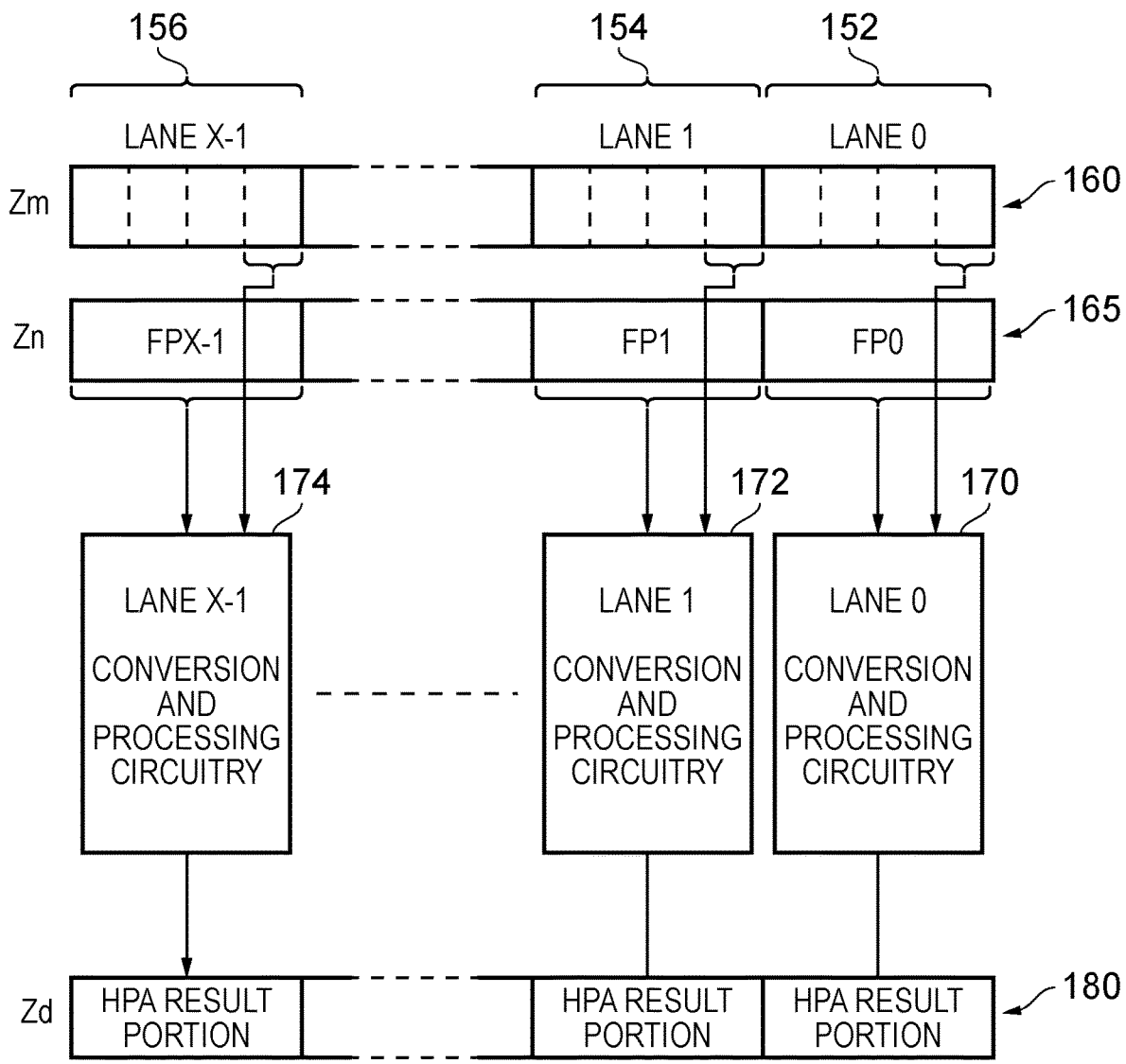
FIG. 6 is a block diagram schematically illustrating how floating-point numbers may be converted into HPA form and processed, in accordance with one example arrangement.

FIG. 6 illustrates how HPA numbers laid out in the manner discussed in FIG. 5A can then be processed in a SIMD manner. In this particular example it is assumed that a series of floating-point numbers are loaded into a source vector register 165. In this example, it is assumed that each floating-point number is a double precision floating-point number, and hence each floating-point number occupies a 64-bit section within the source register 165.

A plurality of 64-bit lanes 152, 154, 156 are considered to extend through the set of vector registers, and separate conversion and processing circuits 170, 172, 174 are associated with each lane. The circuits 170, 172, 174 are arranged to operate on a single portion of an HPA number at a time in order to produce a corresponding result portion to be stored in a destination register 180. It will be understood from the earlier discussed FIG. 5 that each result portion of an HPA result number will occupy a different destination register, and accordingly as the circuits process different portions of an HPA number the corresponding result portions will be written in different destination registers.

As will be discussed in more detail later, metadata is provided for reference by the conversion and processing circuits 170, 172, 174 when performing their conversion and processing steps. In particular, in this example metadata is stored for each lane within a further source register 160. Within a lane's metadata, a metadata portion is provided for each portion of the HPA numbers processed within that lane. The metadata will identify the significance (adjusted anchor) associated with the corresponding portion, and may identify other information, such as the number of overlap bits. When the circuits 170, 172, 174 are processing a particular portion of an HPA number, they will retrieve the associated metadata portion from the lane metadata maintained within the source register 160.

In the example shown in FIG. 6, each conversion and processing circuit will receive an input floating-point operand and the relevant metadata portion for the portion of the HPA number that is to be processed, and will then generate the relevant HPA portion from the input floating-point operand using for example the technique described earlier with reference to the example shown in FIG. 5B. The generated HPA portion could then be stored directly in the result register 180, or may be subjected to some processing function in order to generate the associated result portion. For example, in one embodiment an accumulation operation can be performed, where a current HPA result portion is retrieved from the destination register and then accumulated with the HPA portion generated from the input floating-point operand in order to produce an updated result portion that is then written back into the relevant section of the destination register 180.

By such an approach, it can be seen that via the performance of multiple iterations, multiple accumulate operations can be performed within each of the lanes in parallel in order to generate result portions representing the accumulated result. The process can also be repeated for each of the portions of the HPA number in order to produce a series of result portions within each lane, that collectively represent a result HPA value.

Figure 7:
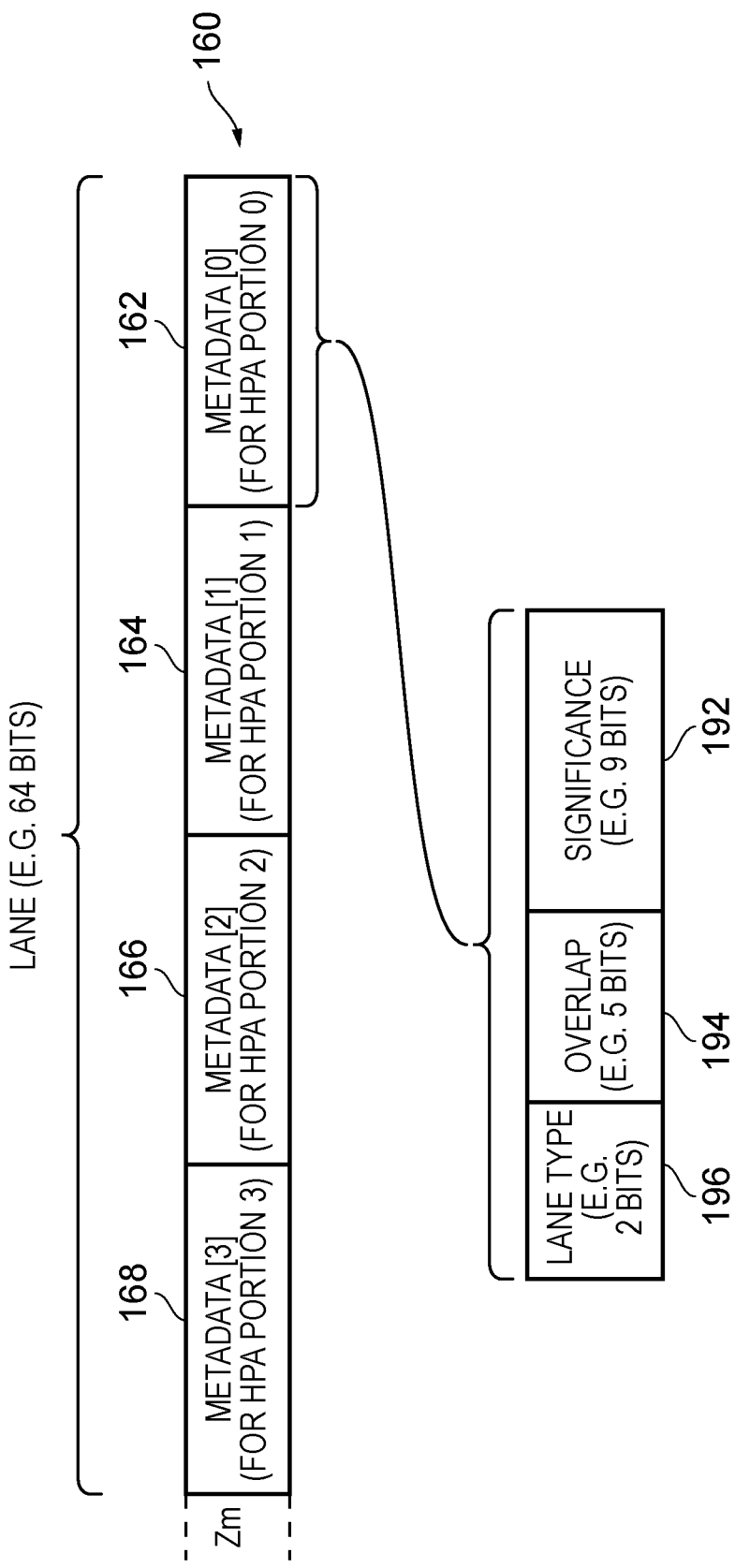
FIG. 7 schematically illustrates the form of metadata that may be used in one example.

In one example arrangement, the HPA processing requires information ("metadata") about the anchor, lane overlap and lane type or position within a wide number—top, bottom, or intermediate. It is anticipated that HPA numbers will typically be no more than 200 bits wide with an anchor range similar to IEEE FP32 so that HPA accumulators will normally comprise no more than four portions. Then the HPA metadata for a 200-bit accumulator traversing 4 64-bit portions can be organized as 4 16-bit fields, as shown in FIG. 7.

In particular, a source register 160 can be specified, where within each lane (for example 64 bits) four metadata portions are provided as indicated by the reference numerals 162, 164, 166, 168. Each metadata portion can then provide the metadata for an associated portion of the accumulator result. As shown by the expanded section in FIG. 7, the significance (adjusted anchor) information can be contained in a first sub-portion 192, for example using 9 bits, whilst the overlap information can be captured in a second sub-portion 194, for example comprising 5 bits. If desired, lane type information can also be captured in a third sub-portion 196, to identify whether the associated portion is the top portion (i.e. representing the most significant bits), the bottom portion (representing the least significant bits) or an intermediate portion.

Within any particular lane, the HPA values that are accumulated will all be arranged to have the same anchor, and accordingly the metadata for a lane will apply equally to all of the HPA values processed within the lane.

In principle, different metadata can be specified for each of the lanes, so that the values processed in one lane do not have to have the same anchor as the values processed in another lane. However, it will often be the case that all of the values processed within all of the lanes will be arranged to have the same anchor value, and in this instance the 64 bits of metadata can be stored and replicated across the whole vector register 160. This enables the various HPA results produced for each of the lanes to in due course then be readily accumulated with each other in order to produce a single scalar HPA result.

In such an arrangement, the SVE instructions for HPA that need to reference the metadata can specify the metadata register along with a 2-bit pointer to the particular 16 bits of metadata for the HPA portion being processed.

It should be noted that, whilst FIG. 7 illustrates one mechanism for providing the metadata, alternate schemes for storing the metadata in a more compressed manner could also be devised so that, for example, 8 lanes of metadata can be stored in 64 bits. In particular, the "lane type" field might not be needed and the ovlp and significance fields could possibly be reduced in size to reflect a limited number of available configurations.

An important HPA operation is converting and accumulating an FP number into HPA format. This operation may be performed on every FP number to be accumulated, whereas other HPA operations (conversion back to FP, eliminating HPA redundancy, etc.) occur thousands of times less frequently. Consequently, it is desirable to provide efficient hardware support for converting and accumulating FP numbers.

Figure 8:
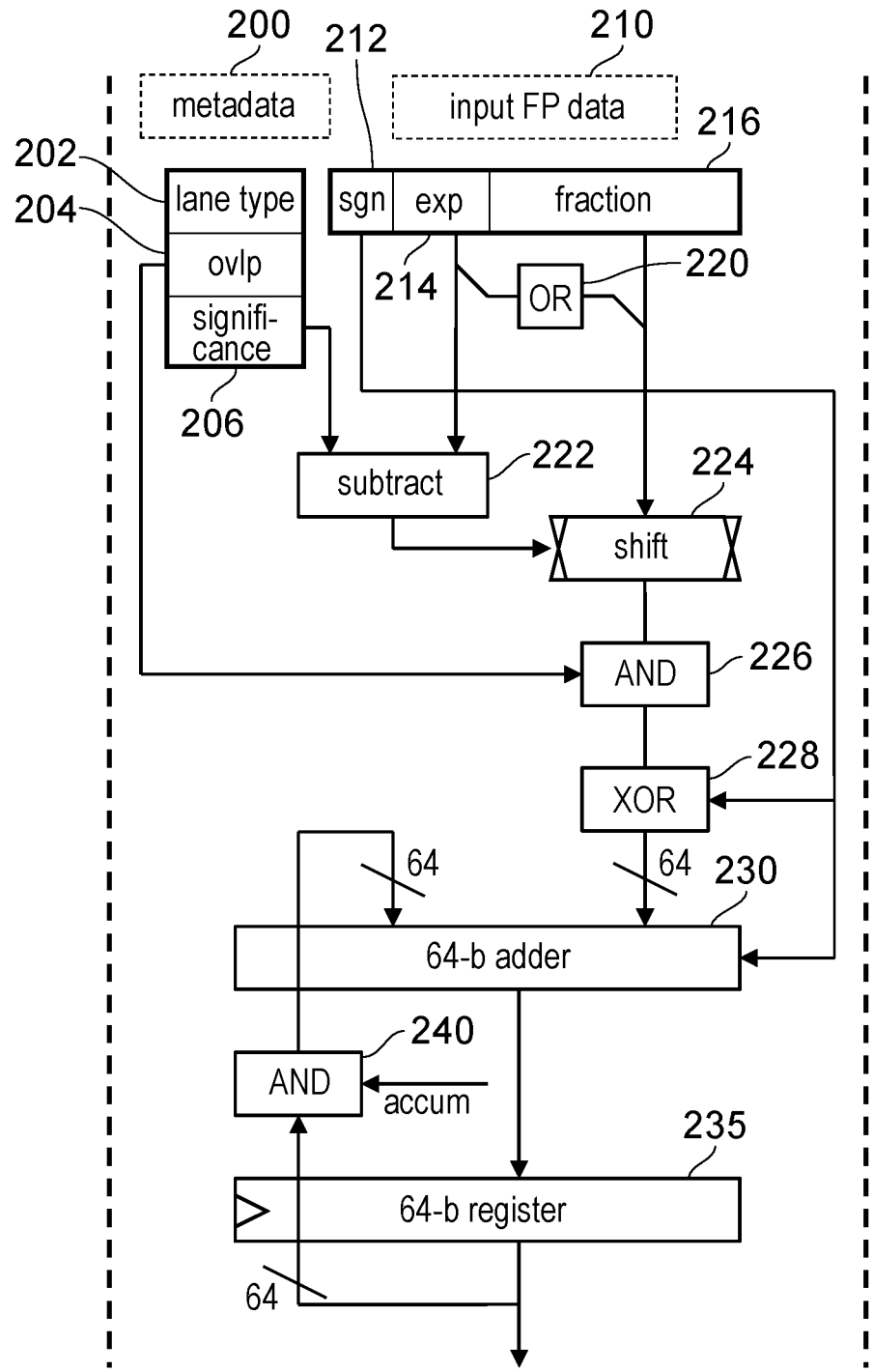
FIG. 8 is a diagram illustrating in more detail conversion and processing circuitry that may be provided in association with each lane, in one example.

FIG. 8 shows a possible 64-bit datapath for this operation that would be repeated across a vector unit, FIG. 8 hence representing in more detail an example configuration for each of the conversion and processing circuits 170, 172, 174 shown in FIG. 6.

Input floating-point data 210 consists of a sign portion 212, exponent portion 214 and fraction portion 216. The relevant metadata portion from the metadata held for a lane is then extracted as the metadata portion 200, this including a lane type field 202, an overlap field 204 and a significance field 206. The OR function 220 performs an OR operation on the bits of the exponent in order to generate the most significant bit of the significand, which is then prepended to the fraction bits 216 in order to form the significand. In particular, if the exponent is non-zero, this indicates that the floating-point number is a normal floating-point number, and accordingly the significand's most significant bit is a logic one value. However, if all of the bits of the exponent are zero, this indicates a sub-normal value, and accordingly the most significant bit of the significand should be set to zero.

The subtract block 222 is arranged to subtract the significance 206 from the exponent 214 (adjusted as necessary for exponent bias and fraction wordlength), for example using the technique described earlier with reference to FIG. 5B in order to produce a shift amount that is then used to control the shift circuitry 224 to shift the floating-point significand by the appropriate amount (performing either a right shift or a left shift as appropriate).

The AND circuitry 226 then receives the overlap information 204, and masks the output from the shift circuitry by the specified number of overlap bits (equal to 64-p). Thereafter, the XOR circuitry 228 performs a two's complement function on the output from the AND circuitry 226 if the floating-point number was negative, as indicated by the sign value 212. At this point, the bits of the input floating-point number pertinent to a particular HPA portion with a given significance and overlap amount are available as a two's complement number, and can be provided as one input to the adder circuitry 230 (the adder also taking a carry-in value of 1 if the floating-point operand is negative). As a result, it can be seen that the relevant HPA portion can be generated "on the fly" from the input floating-point value, and then subjected to a suitable processing operation in order to generate a corresponding result portion.

In the example shown, it is assumed that the processing operation is a selective accumulate operation. In particular, the AND circuitry 240 can be used selectively to propagate the current value held in the register 235 back as a second input to the adder 230, allowing a previous result portion to be accumulated with the input operand portion output from the conversion circuitry, in order to produce an updated result portion stored in the register 235. Incorporating a 64-bit adder and register in the manner shown supports pipelined execution of back-to-back HPA convert-and-accumulate instructions.

There are a number of ways in which the circuitry illustrated in FIG. 8 can be triggered to perform the above described operations, but in one embodiment a single instruction is used to initiate the above described functionality of FIG. 8. Such an instruction can be referred to as an FP-to-HPA convert-and-add instruction.

The opcode for an FP-to-HPA convert-and-add instruction (mnemonic "FCVTH{A}", where {A} denotes optional accumulation) in one example includes identifiers for an FP source register, the metadata register, the destination accumulator register, and an index to select a sub-field of the metadata register. This fits well with an SVE ISA design principle that opcodes reference no more than three vector registers.

Short sequences of existing SVE instructions can be constructed that implement other important HPA operations.

Periodically, it is important to eliminate the redundancy of an HPA number in order to avoid portion overflow. This may be achieved by simply adding the accumulated carry bits in the overlap region of a lower HPA portion to the LSBs of the next highest HPA portion. In SVE this may be accomplished in a 3-instruction procedure:

(i) Arithmetic Shift Right the lower portion by p places;
(ii) Add the shifted overlap bits to the next higher HPA portion;
(iii) AND immediate the overlap bits with a mask derived from p in the lower HPA portion to force them to zero.

This procedure may be applied to every pair of adjacent HPA portions, working up from the lowest lane.

Alternatively, dedicated instructions for overlap propagation and overlap clearing may be provided as described with respect to FIGS. 13 and 14 below.

After a large block of FP numbers has been accumulated, the result will be stored in multiple accumulators laid across a number of SVE lanes. These accumulators may then be added together to return a scalar result for each vector of HPA lanes with the same index. In SVE this may be readily achieved by performing a vector reduce on the accumulators held in multiple HPA lanes to form a scalar HPA result. The resulting scalar HPA number may well contain carry bits in the overlap regions of each portion, and hence the redundancy elimination routine can then be run on the scalar HPA number before converting it back to FP form.

Finally, the accumulated reproducible HPA result may be converted back to floating-point format. An algorithm for converting an HPA portion to a normalized FP64 number exactly (i.e. assuming that p≥53) is as follows:

(i) perform a CLZ (count leading zeroes) to locate the position of the leading '1'
(ii) compute the exponent as significance+(63−CLZ)+FP64 exponent bias (iii) for all but the highest HPA portion, set bit[63] of the FP64 result to 0; set bits [62:52] of the FP64 result to the calculated exponent; if the biased exponent>0, logically shift left the HPA portion by CLZ−11 places: otherwise set the FP64 result to zero.
(iv) for the highest HPA portion only: if the portion is negative, set bit[63] of FP64 result to 1 and negate the portion to obtain a positive 2's-complement number; set bits [62:52] of the FP64 result to the calculated exponent; if the biased exponent>0, logically shift left the HPA portion by CLZ−11 places: otherwise set the FP64 result to zero.

This conversion algorithm can be implemented in typically 15 SVE instructions per HPA lane.

It should be noted that, if desired, the above steps (iii) and (iv) could be combined as follows to cover cases where portions that are not the most significant could be negative:

(iii) if the portion is negative, set bit[63] of FP64 result to 1 and negate the portion to obtain a positive 2's-complement number; set bits [62:52] of the FP64 result to the calculated exponent; if the biased exponent>0, logically shift left the HPA portion by CLZ−11 places: otherwise set the FP64 result to zero.

When desired, a single FP64 result can be produced that represents the final accumulated value as accurately as possible. This can be achieved for example by applying an algorithm suggested by Y. Hida, X. S. Li and D. H. Bailey, "Algorithms for Quad-Double Precision Floating Point Arithmetic," Proc. 15*th IEEE Symposium on Computer Arithmetic*, Vail Colo., June 2001, pp. 155-162.

Working from the bottom pair of lanes up, the Fast2Sum operation is applied successively to the next higher lane and the upper sum obtained from Fast2Sum. Then, the process is repeated working form the topmost pair of values just obtained downwards and applied successively to the next lower value and the lower sum obtained from Fast2Sum. The top-most element of the resulting vector of FP64 numbers may then be guaranteed to be within 0.5 ulp of the HPA number.

An HPA accumulator comprising l portions has a wordlength of by bits and occupies l SVE vector registers. FCVTH{A} instructions executed on a k×128 bit SVE vector unit can convert and accumulate 2k FP64 or 4k FP32 numbers into one portion of 2k HPA accumulators. FCVTH{A} instructions are fully pipelined so that a block of n FP64 addends can be accumulated into 2k p·l-bit HPA accumulators in n·(l/2k)+1 cycles. Typical values of l and k are 2-4 (although k could be as high as 16) so that, if l=k, n FP64 numbers (or 2n FP32 numbers) could be accumulated in k parallel accumulators in n/2 cycles. By contrast, on ARM's Cortex-A72, the same reproducible accumulation would require 3n cycles because the sums have to happen in order, and a dependent fused multiply-add (FMA) requires 3 cycles between adds. Thus HPA offers typically 12 times acceleration for FP32 accumulation over conventional FP processing.

As noted above, HPA redundancy would need to be eliminated or resolved periodically. The method described above takes $3 \cdot (l-1)$ instructions and would need to be performed once every $2^{64-p}$ accumulations: for a typical value of p=50, this represents a tiny processing overhead of <0.1%. Similarly, reducing a vector of HPA accumulators to scalar form, resolving redundancy in the scalar HPA, and converting the scalar HPA back to FP64 format would typically take $1+3 \cdot (l-1)+15 \cdot l \approx 19 \cdot l-3=35-73$ instructions for a representative values of l, compared with $\approx n/4$ cycles for the HPA accumulation of n numbers with n $10^3$ or higher.

Figures 9, 10, 11:
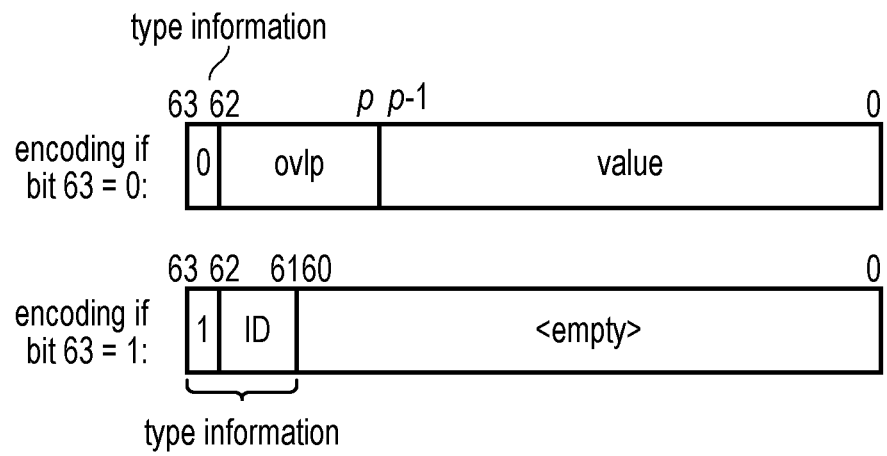
FIG. 9 illustrates encoding of an anchored-data element which includes type information indicating whether the anchored-data element represents a portion of bits of a two's complement number or represents a special value.
FIG. 10 shows an encoding of the type information.
FIG. 11 shows different outcomes for setting the type information of a result anchored-data element based on the type information of first and second operands.

FIG. 9 shows another example of an encoding for an anchored-data element which includes type information specifying whether the anchored-data element represents a portion of a two's complement number or a special value. Note that the type information in the anchored-data element is different to the lane type information 196 in the metadata as shown in FIG. 7. In this encoding the most significant bit (bit 63 in this example) is used to signify whether the element represents a standard HPA digit representing a portion of a two's complement number or a special value. When the most significant bit is 0 then the HPA element represents a standard HPA digit, representing a two's complement number, where the bits in the overlap portion have the same significance as the least significant bits of a next highest digit in the HPA value, similar to the examples described above.

However, when the most significant bit of the element is 1, the element represents a HPA special value selected from the set: positive infinity, negative infinity, not-a-number (NaN) and a saturated value. When the most significant bit is 1 then the next two most significant bits (e.g. bits 61 and 62 as shown in FIG. 9) represent the specific type of special value represented. FIG. 10 shows the encoding of bits 63 to 61 for the standard HPA digit and the respective types of special value.

Hence, when the most significant bit is 0 then the next two bits represent some of the overlap bits of the HPA digit. Alternatively, if a non-redundant HPA variant is used which does not have overlap bits, the next two bits may represent non-overlap bits of the HPA digit. Hence, the bits which would otherwise be used to signify which specific type of special value is encoded can be reused for representing bits of a two's complement number, which helps to provide an efficient encoding.

When the most significant bit is 1 and the third most significant bit is 0 then the HPA element represents an infinity. The second most significant bit represents the sign of the infinity. Hence an encoding of 110 for bits 63 to 61 of the element may represent negative infinity and an encoding 100 may represent positive infinity. It would also be possible for the encodings of positive and negative infinity to be swapped. When an HPA element is indicated as representing positive or negative infinity, then this means that it was generated in a sequence of operations in which at least one operation involved the conversion of a floating-point value to the HPA format, where that floating-point value was positive or negative infinity.

When the most significant three bits of the element indicate 101 then the element represents a not-a-number (NaN). This may arise in two ways. Either, the element may be generated in a series of operations which involves conversion of a floating-point value which was a NaN, or the element may depend on an addition of two HPA values where one of the HPA values was positive infinity and the other was negative infinity.

On the other hand, when the most significant three bits of the HPA elements are encoded as 111 then this represents that the value is a saturated HPA value. The saturated HPA value has no analogue in the floating-point domain. Whereas the positive or the negative infinity indicates that the HPA value resulted from conversion of a floating-point value which was positive or negative infinity, where that floating-point value would have been derived from calculations which resulted in a number which is of greater magnitude than can be represented in the floating-point format, the saturated HPA type may indicate that while any floating-point numbers input to a series of HPA operations may have been non-special numbers which are not a NaN or infinity, saturation has arisen as a result of the HPA operations themselves, for example because the anchor metadata setting the range of significance that can be represented by the HPA value was such that the input floating-point values and/or the result of processing those values has generated a number which is outside the range defined by the metadata.

The saturated type could for example be generated when an HPA operation which is acting on the most significant HPA element of an HPA value (as indicated by the lane information 196 shown in FIG. 7) results in an overflow from the most significant overlap bit. Alternatively, if the overlap bits of the most significant HPA element and the HPA value are not considered part of the two's complement number represented by the HPA value then the saturated type may result if the most significant elements of an HPA value overflows from the most significant non-overlap bit to the least significant overlap bit. In the case where the overlap bits of the top element of the HPA value are considered part of the overall two's complement number represented by the HPA value, the encoding of the saturated type as 111 in bits 63 to 61 can be particularly useful because it will mean that, by definition, if there is an overflow from the top overlap bit the top two overlap bits will already both be equal to 1 and the overflow will result in the most significant bit of the element switching from 0 to 1, so that the overflow itself may cause the corresponding element to be set with the type information in the top three bits equal to 111. This can simplify the logic for setting the type information as it may not require a specific circuitry to detect the overflow and set the type information accordingly. On the other hand, if the overlap bits are not considered part of the two's complement number represented by the HPA value then some additional logic may detect the overflow from the top non-overlap bit into the overlap region, and set the top three bits of the type information accordingly.

Optionally, the saturated type could also be used when underflows occur in an HPA operation. For example, if a floating-point value to be converted into HPA format represents a number for which a precise representation in the HPA format would require some bits which are less significant than the least significant bit representable using the HPA format as defined by the anchor metadata, then this may be detected as an underflow and a saturated datatype could be indicated. Alternatively a type encoding which distinguishes overflows from underflows could be used. However, in practice overflows may be more important to signal than underflows since the underflows may simply lead to loss of precision whereas the overflow may result in the incorrect processing result being returned. Hence in some cases the choice may be made not to signal underflows using the datatype indicated by the type information.

Hence in general by providing the type information to support indication of a saturated type of HPA value, this can allow the program code to determine, after a sequence of HPA operations, whether any special values resulting from those operations were caused by the input floating-point numbers being special numbers or by an overflow occurring due to the HPA processing. This can be useful because in the second scenario the program code may be able to adjust the anchor metadata and then repeat the sequence of operations in order to maintain a valid result, whereas if the special values arose from the special numbers in the original floating-point values then repeating the HPA processing with different anchor metadata would still not produce a non-special result.

While FIG. 10 shows one particular encoding of the type information which can be useful for providing an efficient encoding scheme, other encoding schemes could also be used.

FIG. 9 shows the encoding for a single HPA element. When an HPA value is formed of two or more HPA elements then the overall value may be considered special if any one of those HPA elements has the top bit set to 1 to indicate a special value. In practice, as the HPA value may be striped across a number of different vector registers as shown in FIG. 5A, each HPA processing instruction may only see one element at a time and it may not be apparent when processing one of the HPA elements that one of the other HPA elements of the same vector value will detect a special value or overflow. While if an input floating-point value is an infinity or a not-a-number, this may result in all of the elements of the HPA value to which that floating-point number is converted being set to indicate a special value, in the case of saturation arising from the HPA process then the saturated type may only be indicated in the most significant HPA element of the HPA value for example.

When two HPA elements are added together, then the type information of the result element may be set depending on the type information in the two elements being added. FIG. 11 shows a table showing the different datatypes that can arise depending on the datatypes of the first operand and the second operand. The column on the left hand side of the table shows the different options for the data type in the first operand and the row along the top of the table shows the different options for the data type in the second operand. The abbreviation Num represents a standard two's complement number, i.e the datatype when the most significant bit of the element is 0.

As shown in FIG. 11, if both the input operands being added are standard two's complement numbers then the result can either be another standard two's complement number, or the saturated value in the case where there is an overflow from the most significant element of an HPA value. In cases where at least one of the two operands being added is a special value, then the result will be special too. Hence, the most significant bit of an HPA element is sticky in the sense that once it is set to 1, all subsequent HPA elements which depend on that element will be generated with the most significant bit equal to 1 so that the occurrence of a special value can be detected at the end of a sequence of operations.

As shown in FIG. 11, if either of the operands being added is a NaN then the result will also be a NaN. A NaN can also result if one of the operands being added is positive infinity and the other is negative infinity. If one of the operands being added is positive infinity and the other is anything other than negative infinity or a NaN, then the result will be positive infinity. Similarly, if one of the operands is negative infinity and the other is anything other than positive infinity or a NaN then the result will be negative infinity. Finally, if at least one of the operands is a saturated value then the result will also be saturated if the other operand is either a standard two's complement number or a saturated value.

In some cases an exception may be triggered in response to an HPA addition which causes certain outcomes. In a case where the two operands being added were standard two's complement numbers but an overflow occurs and so the result is saturated, then an overflow exception may be signalled. For HPA elements other than the most significant element of an HPA value, this exception should not arise since the program code should trigger the overlap propagation operation after a certain number of HPA additions have been performed, where that number is selected so that that number of HPA additions cannot result in an overflow beyond the top overlap bit. However, for the most significant element it is possible that the overflow could occur if the anchor metadata has not been set correctly.

If adding unlike signed floating-point infinities, so that the result is set to a NaN, then then an invalid operand exception could be raised.

Other types of exceptions could be raised when converting from floating-point to HPA or from HPA to floating-point depending on the type of special value represented.

Figure 12:
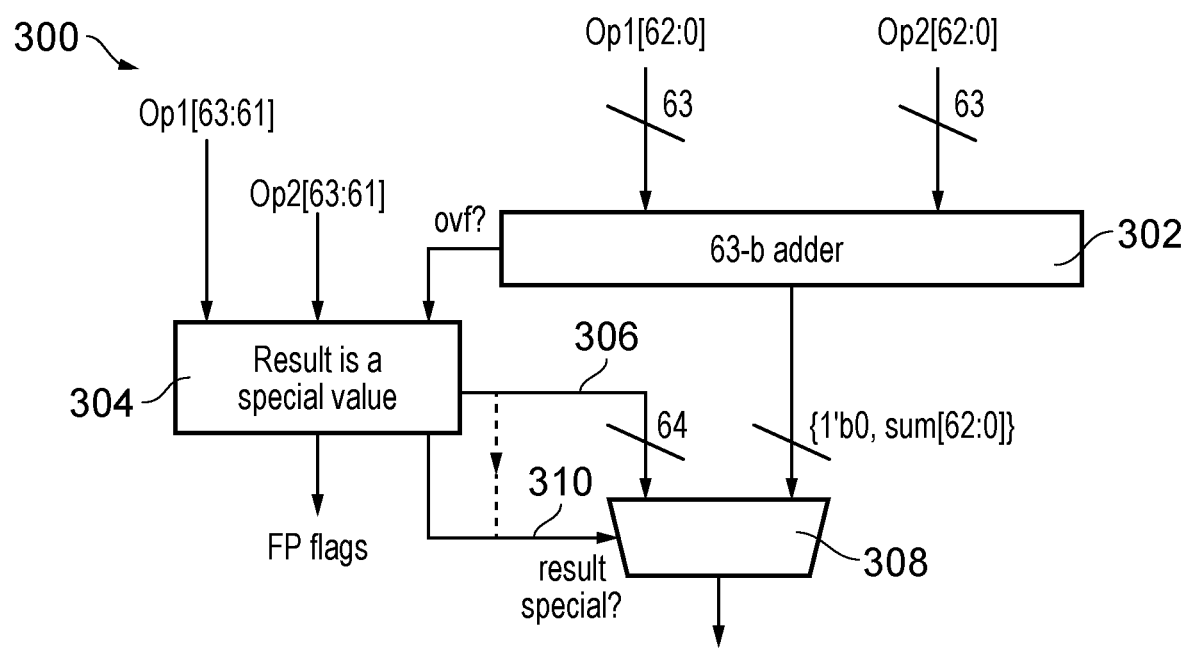
FIG. 12 shows an example of circuit logic for implementing an addition of two anchored-data elements comprising the type information.

FIG. 12 shows an example of circuit logic 300 for performing an HPA addition when considering the special values encoded as in the example of FIGS. 9 to 11. The circuit logic 300 includes a 63-bit adder 302 and special value detection circuitry 304. The adder 302 receives the lower 63 bits of each of the two HPA elements being added, excluding the most significant bit which indicates whether the value is a special value, and adds the two sets of 63 bits together to produce a 63-bit sum, which is prefixed with a single bit value of 0 to produce a 64-bit result encoded as a non-special value, and supplied to a multiplexer 308.

In parallel with the addition by the adder, the special value detection circuitry 304 receives the type information (top three bits) of each of the HPA elements to be added. The special value detection circuitry 304 checks the type information to determine which special values if any are represented and based on the combinations shown in the table of FIG. 11, the logic 304 determines whether the result should represent a special value and if so which type of special value should be encoded. When the result is to be a special value then the special value detection circuitry generates a 64-bit result 306 with the top three bits encoded according to the type of special value indicated in the table of FIG. 11, selected based on the types of the two operands. The bit values in the lowest 61 bits can take any value in the case when the result is special, as once a special value arises then the HPA value can no longer represent a valid two's complement number in range and so it is not important what information is specified in the lowest 61 bits.

The multiplexer 308 selects between the 64-bit value provided by the special value detection circuitry 304 and the 64 bits provided by the adder including the top bit equal to 0 to indicate a non-special number. The multiplexer makes this selection based on a value 310 provided by the special value detection circuitry indicating whether the result should be special. In practice this signal 310 could simply be the upper bit of the 64-bit value 306 as shown in the dotted line of FIG. 12.

Hence, as the special value detection circuitry 304 acts in parallel with the adder itself, the logic has high speed as it has the same logic depth as a standard saturating integer adder.

When the result is a special value then the special value detection circuitry 304 may also set various floating-point status flags depending on the outcome, which may indicate properties of floating-point operations. This allows the HPA processing to mirror the processing which would be expected if the processing had been carried out entirely using floating-point arithmetic. For example these floating-point flags can indicate whether an underflow or overflow exception should be signalled or whether there has been an invalid operation.

FIG. 12 shows a single lane of addition, but it will be appreciated that this circuit logic could be provided for each vector lane when separate additions are performed on respective pairs of HPA elements in corresponding lanes of a pair of vector registers, similar to the vectorisation of the conversion operation shown in FIG. 6.

The consideration of special HPA values may also be made when performing overlap propagation operations. FIG. 13 shows an overlap propagation instruction, which is a vector instruction specifying three vector registers as inputs. Vector register Zdu provides an HPA element which is expected to represent the upper HPA element of a pair of adjacent HPA elements of the same HPA value, and also acts as a destination register which will store an updated value for that upper HPA element of the pair. Source vector register Zl is a vector where each lane provides the lower element of the pair of elements corresponding to the upper elements in the corresponding vector lanes of Zdu. Vector register Zm provides the anchor metadata for each of the lanes of vector processing. In general the anchor metadata in register Zm should be the anchor metadata associated with the lower HPA elements of each pair as specified in input register Zl, although if the number of overlap bits is the same in the upper and lower HPA elements of each pair then it would also be possible to use the register which provides the anchor metadata for the upper element of each pair. Hence, each vector lane of the 3 registers relates to a different HPA value and specifies a pair of adjacent elements Li, Ui and the corresponding metadata Mi for that HPA value (in this example, there are 4 vector lanes so i=0 . . . 3, but other examples could have a different number of lanes).

Hence, within each lane of vector processing, an overlap propagation operation 350 is performed based on the lower and upper element Li, Ui of the corresponding pair of adjacent elements of a given HPA value, and on the metadata Mi associated with that pair, to generate an updated value Ui' which is stored to the corresponding element position within the destination register Zdu.

Figure 13:
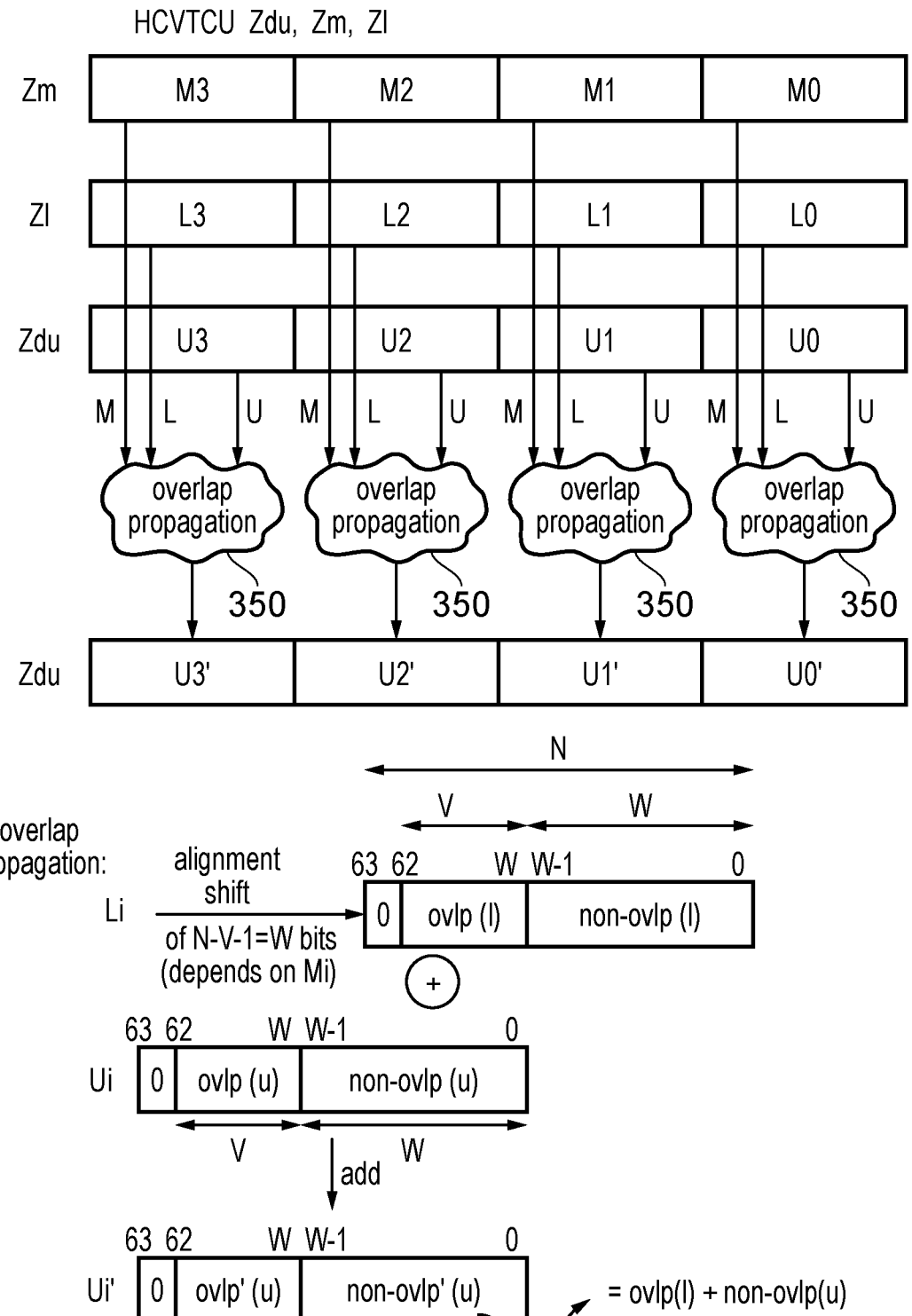
FIG. 13 shows an example of an overlap propagation instruction.

The operations performed within each lane of the overlap propagation function 350 are shown at the bottom of FIG. 13. As shown, the operation comprises a right shift of the lower element Li of the corresponding pair of elements by an alignment shift amount which depends on the metadata in the corresponding lane Mi of the metadata register Zm. The size of the alignment shift in the vector may correspond to the number of non-overlap bits W within the lower element Li of each pair. As the different vector lanes correspond to entirely different HPA values, it is possible that different vector lanes may have different sizes of alignment shift, if the metadata for those different lanes specifies different numbers of overlap bits. The alignment shift amount could be determined in different ways depending on the way in which the number of overlap bits is encoded. If the number of non-overlap bits was directly specified by the metadata then this could simply be used directly as the alignment shift. However if the metadata specifies the number of overlap bits V then it could be derived from the total number of bits N in the data element and the number of overlap bits V so that the alignment shift size SH equals N−V−1, when 1 bit is used as the indicator of whether the value is special.

Hence, having right shifted the lower element of the pair by W bits, the shifted value is added to the corresponding upper element Ui of the pair to generate the updated value Ui' which is stored in to the corresponding lane of the destination register. Hence, in cases where neither of the upper and lower elements is a special number, then the updated value for the upper element Ui' will be set so that the non-overlap bits are equal to the sum of the overlap bits of lower element and the non-overlap bits of the upper element in the pair.

However, if either the top bit of the lower element Li is 1 or the top bit of the upper element Ui is 1 indicating that either of these elements is a special HPA value, then the upper element can be left unchanged, without performing the shift and the addition of the overlap and non-overlap bits. This can reduce the amount of logic required. Hence, special values and elements which are adjacent to special values may be left unchanged during the carry elimination, so that the fact that a special value has arisen can be detected at the end of a sequence of HPA operations. The whole HPA number may be considered numerically invalid if any one or more elements of that HPA number are special values.

Alternatively, another approach for handling the occurrence of special values could be that if the lower element Li of the pair is special, the type information from the lower element Li can be copied to the type information of the updated upper element Ui' which is written to the destination register Zdu. With this approach then when a series of carry eliminations are performed by executing the carry propagation instruction on successive pairs of adjacent elements of an HPA value, then gradually the signalling of the special value may be propagated through to the top lane, which could make the detection of whether any special values have been generated simpler when the end of a series of HPA operations has been reached, as this may allow the presence of special values to be detected simply from checking the type information of the top lane, rather than needing to check the type information in all of the elements of the HPA value.

On the other hand, if both the lower element and the upper element of the pair were non-special, but the addition of the non-overlap bits in the upper element and overlap bits in the lower element causes an overflow, then bits 63 to 61 of the updated upper elements Ui' may be set to 111 to indicate a saturated value similar to the case for an addition as described above.

The operation shown at the bottom of FIG. 13 may be performed independently for each lane of the vector processing, so that it is possible for the overlap propagation in one lane to generate a special value while another lane does not.

The provision of a dedicated overlap propagation instruction as shown in FIG. 13 can greatly reduce the code size required for carrying out overlap propagation, compared to if separate instructions for performing the alignment shift, addition and setting of the type information were required.

Figure 14:
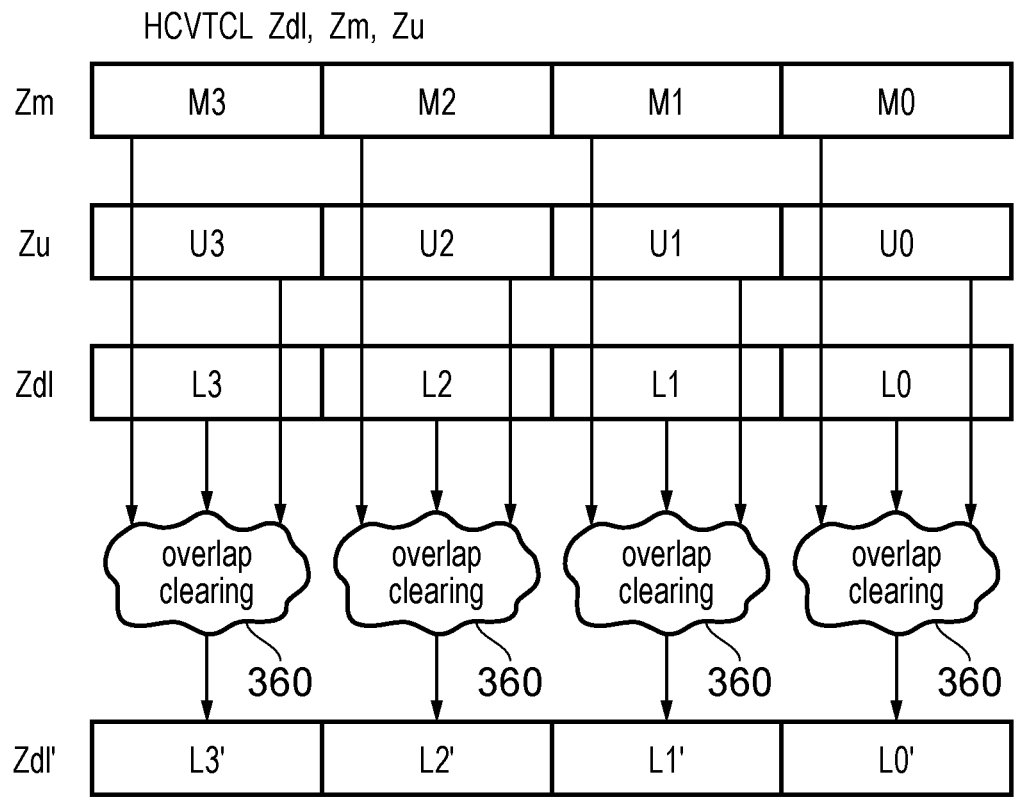
FIG. 14 shows an example of an overlap clearing instruction.
Figure 14:
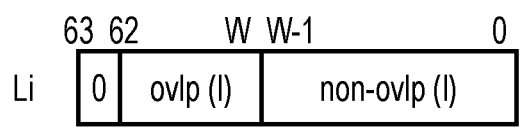
Figure 14:
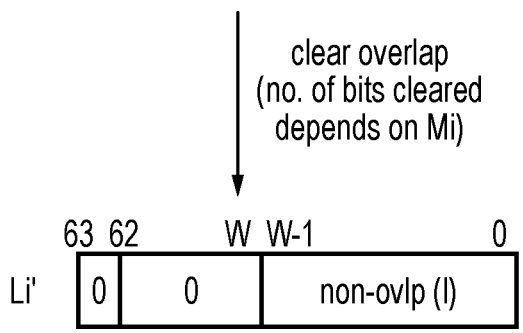

FIG. 14 shows a corresponding overlap clearing instruction for removing the overlap bits following an overlap propagation operation as shown in FIG. 13. That is, once the overlap bits of the lower element of the pair have been added into the upper element, the overlap bits in the lower element can be cleared to 0.

As for the overlap propagation instruction, the overlap clearing instruction specifies three vector registers, however this time the destination register Zdl provides the lower HPA element of a pair of adjacent HPA elements of a HPA number, which will be updated as a result of the overlap clearing instruction. The other two source registers Zm, Zu represent the metadata and the upper element of the pair respectively. Again, these are vector registers and so a number of independent lanes of processing are performed on each set of correspondingly positioned vector elements in the respective registers. This time the operation performed on each set of corresponding elements is an overlap clearing operation 360 which takes as inputs the values of the pair of HPA elements Li and Ui and the corresponding metadata Mi and generates an updated value Li' to be written back to the corresponding lane of the destination register Zdl.

The operation performed in each of the overlap clearing functions 360 is shown at the bottom of FIG. 14. As shown in FIG. 14, the overlap clearing operation simply clears the overlap bits of the lower element Li to 0, where the number of bits that are set to 0 will depend on the number of overlap bits 194 specified in the corresponding element Mi of the metadata Zm. The non-overlap bits of the lower element remain unchanged. In cases when neither the lower element or the upper element represents a special value, the clearing of the overlap bits in the lower element is independent of the upper element Zu.

If the lower element Li has its top bit set to 1 to indicate a special value, then the lower element may be left unchanged so that the updated value Li' is equal to the input value Li. Optionally, the lower element may also be left unchanged if the upper element Ui is special, although this is not essential. If in a particular embodiment the overlap clearing is to be performed regardless of whether the upper element is indicated as a special value, it is not necessary for the instruction to specify the register Zu corresponding to the upper element Ui at all. However, it can be useful for the operation to depend on whether the upper element is special to avoid performing unnecessary writes to the destination register. Unlike for the overlap propagation instruction of FIG. 13, for the overlap clearing instruction of FIG. 14 it is less likely that it would be desirable to propagate special values from the lower element to the upper element of a given pair of adjacent elements within the HPA value, because this would require a second destination register for the instruction and many microarchitectures may not have sufficient write ports to do this.

Hence, in use, it would be expected that the overlap clearing instruction of FIG. 14 may follow an overlap propagation instruction as shown in FIG. 13 which acts on the same pair of registers specified as the lower and upper registers. Splitting this operation into two separate instructions can be useful to ensure that each instruction only needs to specify one destination register, which as discussed above is simpler to implement in microarchitecture.

However, in architectures where instructions specifying two different destination registers to be updated in response to the same instruction are permitted, then it would be possible for a combined instruction to perform both the functions of FIGS. 13 and 14. That is, in the cases of non-special inputs the instruction could trigger both the addition of the overlap bits of the lower element into the non-overlap bits of the upper element, and also clear the overlap bits of the lower element to 0. Such an instruction may handle special values in the same way as discussed above for FIGS. 13 and 14, where if either value is special at the input registers then the output values may be left unchanged, or the type information of the lower element is propagated through to the upper element.

While FIGS. 13 and 14 show examples where the first and second anchored-data elements acted on by the overlap propagation instruction and the overlap clearing instruction are a pair of adjacent elements Li, Ui of the same HPA value, this is not essential. Another use case can be where the first anchored-data element (Li) specified by the overlap propagation/clearing instruction is the most significant element of a given HPA value, and the second anchored-data element (Ui) is an "empty" HPA element populated with only sign bits. This could be useful if the HPA value including the first anchored-data value is to be added to another HPA value which includes bits of greater significance than, in which case the carry bits from the first anchored-data value may need to be added to a lane of greater significance within the second HPA value, which can be made simpler by first stripping out the overlap bits from the top element of the first HPA value and adding them into the non-overlap bits of an otherwise "empty" HPA element which can be given a lane significance corresponding to that of the relevant HPA element of the second HPA value. It will be appreciated that other use cases are possible for the instructions shown in FIGS. 13 and 14.

Anchored-Data Select Value

Figure 15:
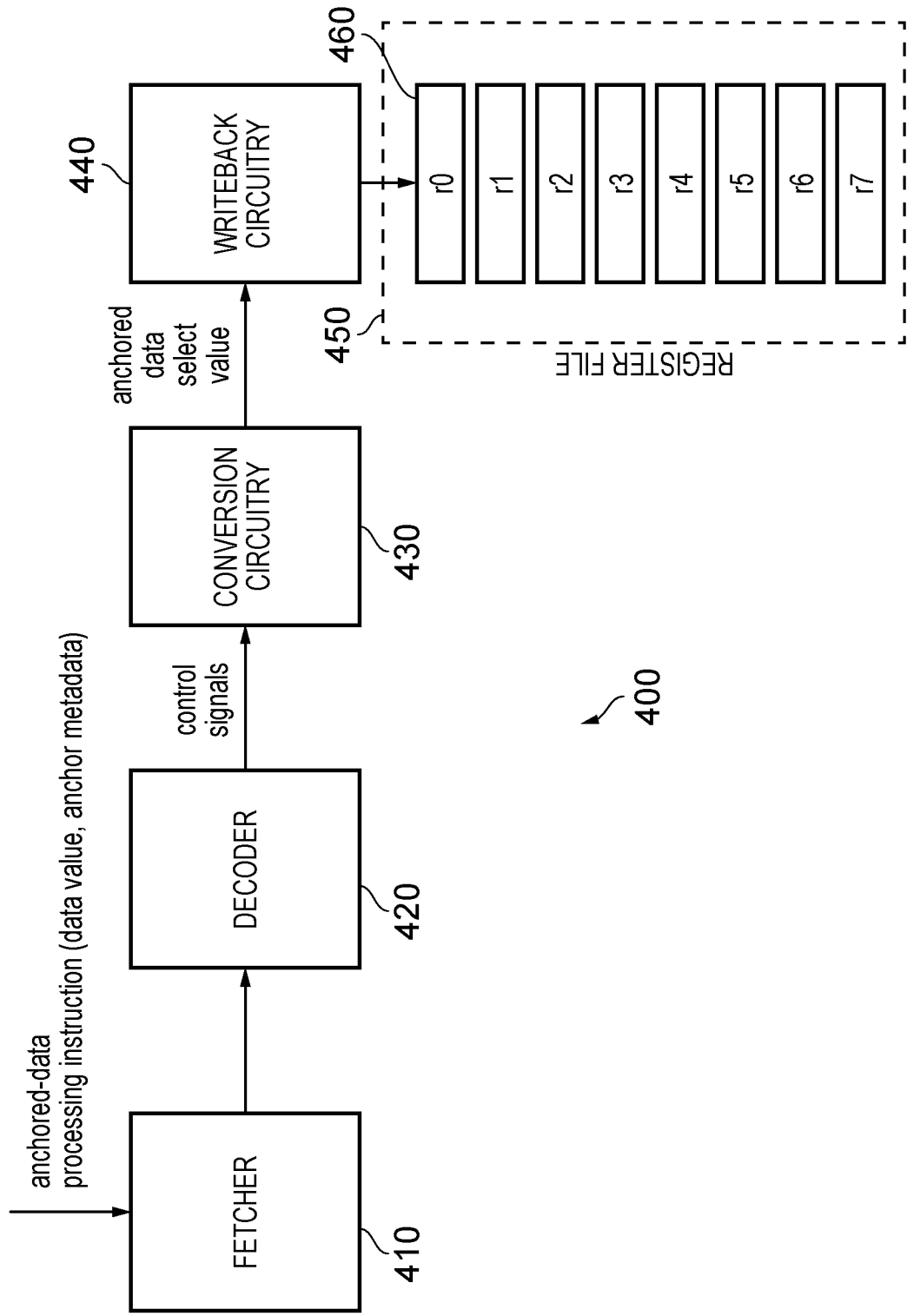
FIG. 15 schematically illustrates an apparatus 400 for performing an anchored-data processing instruction on a data value using anchor metadata to produce an anchored-data select value.

FIG. 15 schematically illustrates an apparatus 400 for performing an anchored-data processing instruction on a data value, using anchor metadata. The data value to be converted could be a floating-point number, or could be (part of) the result of the product of two floating-point numbers, such as the significand that is produced by multiplying the significands of two floating-point numbers together.

In any event, the instruction is received by a fetcher 410, which passes the instruction to a decoder 420. The decoder 420 generated one or more control signals that are received by the conversion circuitry 430. The conversion circuitry generated an anchored-data select value, which is passed to writeback circuitry 440, which writes the anchored data select value to a register 460 in, for instance, a register file 450. The anchored-data select value could be a set of bits that correspond with one element of an HPA number. The anchored-data select value may however, exclude overlap bits that may be present in a real HPA number.

In this example, the conversion circuitry 430 may extracts bits from the data value in order to produce the anchored-data select value. The bits that are extracted, and how they are used to form the anchored-data select value may be dependent on the provided metadata, together with an exponent associated with the data value.

There are a number of ways in which the data value and the anchor metadata can be provided. In some embodiments, the instruction contains references to registers (which may include the previously mentioned vector registers) where the data value and the anchor metadata can be located.

Figure 16:
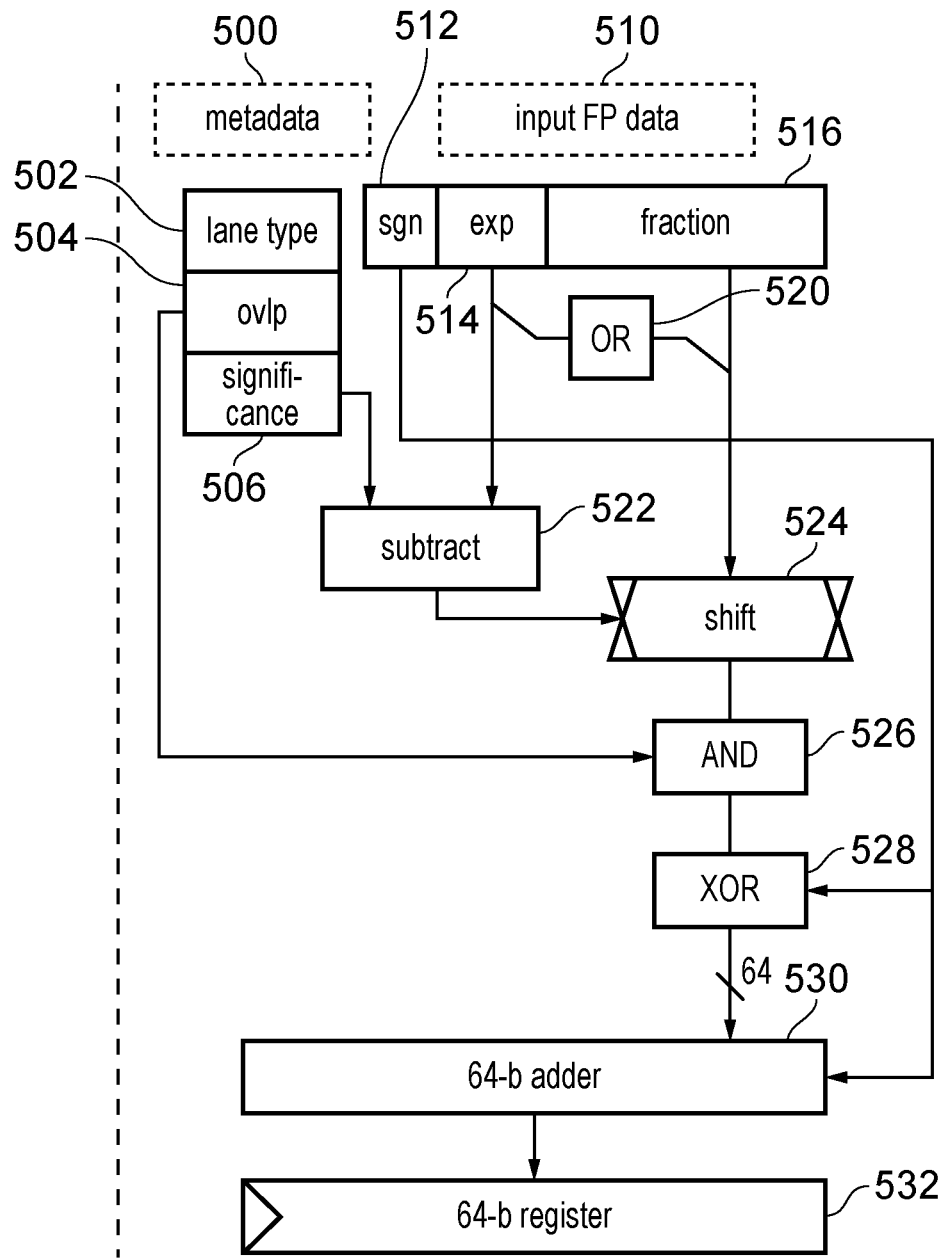
FIG. 16 illustrates conversion circuitry, for performing an extraction instruction.

FIG. 16 illustrates conversion circuitry, for performing an extraction instruction. Such circuitry may be repeated across a vector unit, FIG. 16 hence representing in more detail an example configuration for each of the conversion and processing circuits 170, 172, 174 shown in FIG. 6.

Input floating-point data 510 consists of a sign portion 512, exponent portion 514 and fraction portion 516. The relevant metadata portion from the metadata held for a lane is then extracted as the metadata portion 500, this including a lane type field 502, an overlap field 504 and a significance field 506. The OR function 220 performs an OR operation on the bits of the exponent in order to generate the most significant bit of the significand, which is then prepended to the fraction bits 516 in order to form the significand. In particular, if the exponent is non-zero, this indicates that the floating-point number is a normal floating-point number, and accordingly the significand's most significant bit is a logic one value. However, if all of the bits of the exponent are zero, this indicates a sub-normal value, and accordingly the most significant bit of the significand should be set to zero.

The subtract block 522 is arranged to subtract the significance 506 from the exponent 514 (adjusted as necessary for exponent bias and fraction wordlength), for example using the technique described earlier with reference to Table 7 in order to produce a shift amount that is then used to control the shift circuitry 524 to shift the floating-point significand by the appropriate amount (performing either a right shift or a left shift as appropriate).

The AND circuitry 526 then receives the overlap information 504, and masks the output from the shift circuitry by the specified number of overlap bits (equal to 64-p). Thereafter, the XOR circuitry 528 performs a first part of a two's complement function on the output from the AND circuitry 526 if the floating-point number was negative, as indicated by the sign value 512. The result of this is then passed to a 64-bit adder 532 in order to add the sign bit 512 ('1' if the input FP data was negative, and '0' otherwise). In other words, a '1' is added if the input FP data was negative. This therefore completes the two's complement operation. At this point, the bits of the input floating-point number pertinent to a particular HPA portion with a given significance and overlap amount are available as a two's complement number, and can be provided as an output to, for instance a 64-bit output register 532.

There are a number of ways in which the circuitry illustrated in FIG. 16 can be triggered to perform the above described operations, but in one embodiment a single instruction is used to initiate the above described functionality of FIG. 16. Such an instruction can be referred to as an HEXTRACT instruction.

The opcode for an HEXTRACT instruction in one example includes identifiers for an FP source register, the metadata register, and the destination accumulator register. This fits well with an SVE ISA design principle that opcodes reference no more than three vector registers.

Figure 17:
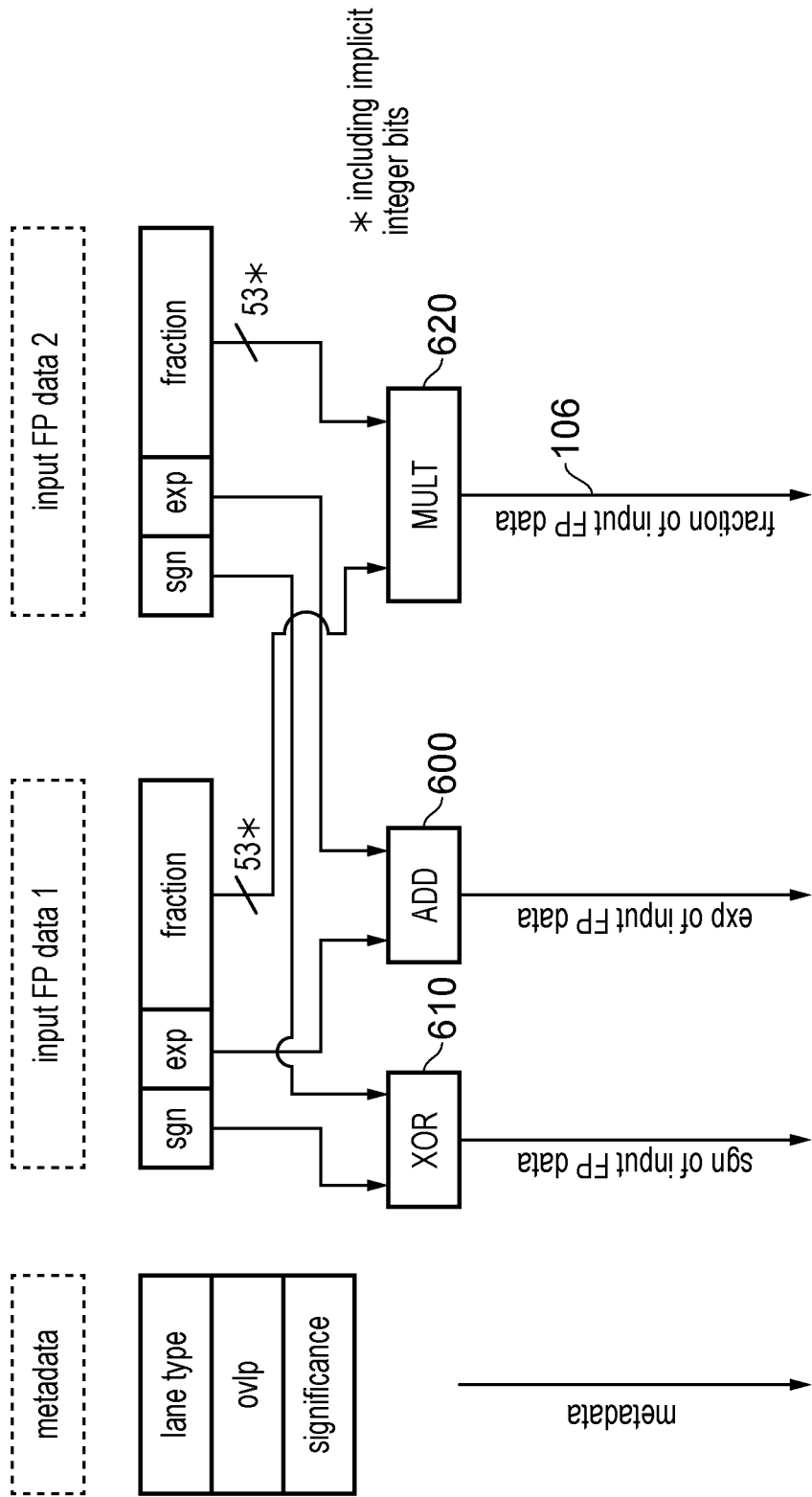
FIG. 17 illustrates an addition to the conversion circuitry illustrated in, for instance, FIG. 16, which handles the conversion of floating-point products.

FIG. 17 illustrates an addition to the conversion circuitry illustrated in, for instance, FIG. 16, which handles the conversion of floating-point products.

In FIG. 17, a pair of floating-point numbers (input FP data 1 and input FP data 2) that are to be multiplied together are provided. These each comprise a sign bit, an exponent, and a fraction. The different components of the two floating-point numbers are handled separately. The two fractional components (including the implicit integer bits) are multiplied together using multiplication unit 620. In this example, it is assumed that the two floating-point numbers are double precision numbers. The significands are therefore 53 bits each (including the implicit integer bits), and so the product of the two significands is 106 bits. The two exponents are added together by addition circuitry 600. Finally, the sign bits are handled by use of a XOR gate 610, which causes the output sign bit to be negative if the two input sign bits differ and to be positive if the two input sign bits match.

The outputs from the XOR unit 610, adder 600, and multiplication unit 620 can be passed as the input FP data 510 of the conversion circuitry in FIG. 16, together with the metadata in order to convert the result of the multiplication into an anchored-data select value.

Figure 18:
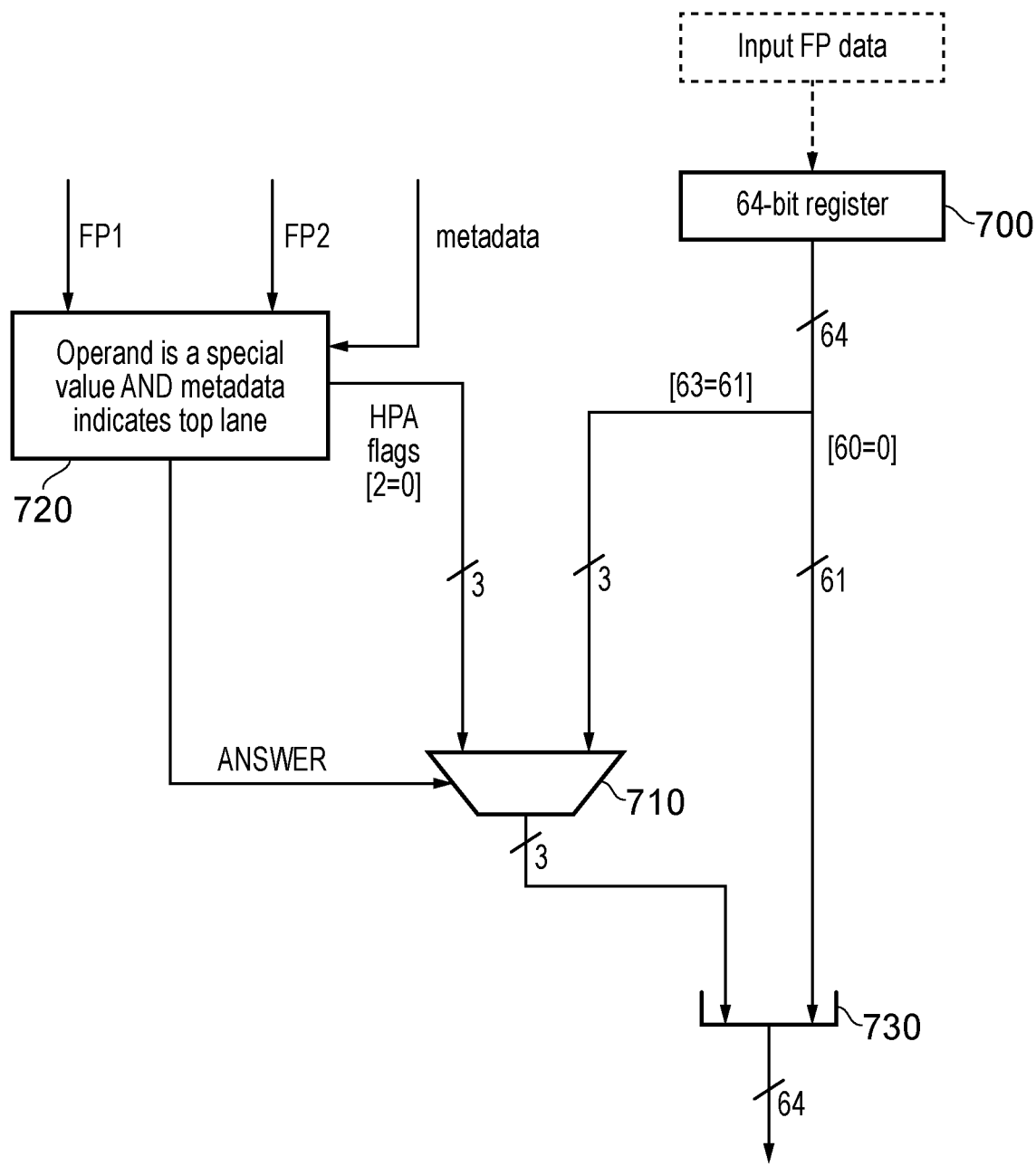
FIG. 18 illustrates how special floating point values can be handled.

FIG. 18 illustrates how special floating point values such as NaN, positive infinity, and negative infinity can be handled. The process is analogous to the technique described with reference to FIG. 9, except that since the input floating-point values cannot be "saturated", such an input need not be handled.

An input FP data is provided in the form of the product of two floating point numbers being multiplied together. Through the conversion circuitry, an anchored-data select value is stored in a register such as a 64-bit register 700. The top three bits of this value are extracted, and passed to a multiplexer 710. At a similar time the two floating point numbers are individually passed to an analysis unit 720, together with the metadata used to generate the anchored-data select value. The analysis unit 720 determines whether either of the operands is one of the previously mentioned special floating-point values, and also whether the metadata indicates that the anchored-data select value belongs to a top lane. If both of these conditions are met, then a set of 3 bits representing HPA flags are output by the analysis unit 720, as previously discussed with reference to FIGS. 10 and 11. In addition, a signal is passed to the multiplexer 710. The signal causes the multiplexer to select the HPA flags rather than the original top three flags from the 64-bit register when one of the operands is special. Otherwise, the original three bits are selected. The bits selected by the multiplexer 710 are then appended to the remaining 61 bits of the 64-bit register 700 by concatenation circuitry 730.

The result of this circuitry is that if one of the two operands (the two floating point numbers) that are multiplied together is a special value then a set of 3 HPA flag bits replace the top three bits of the value calculated by the conversion circuitry. Otherwise, no change takes place.

Figure 19:
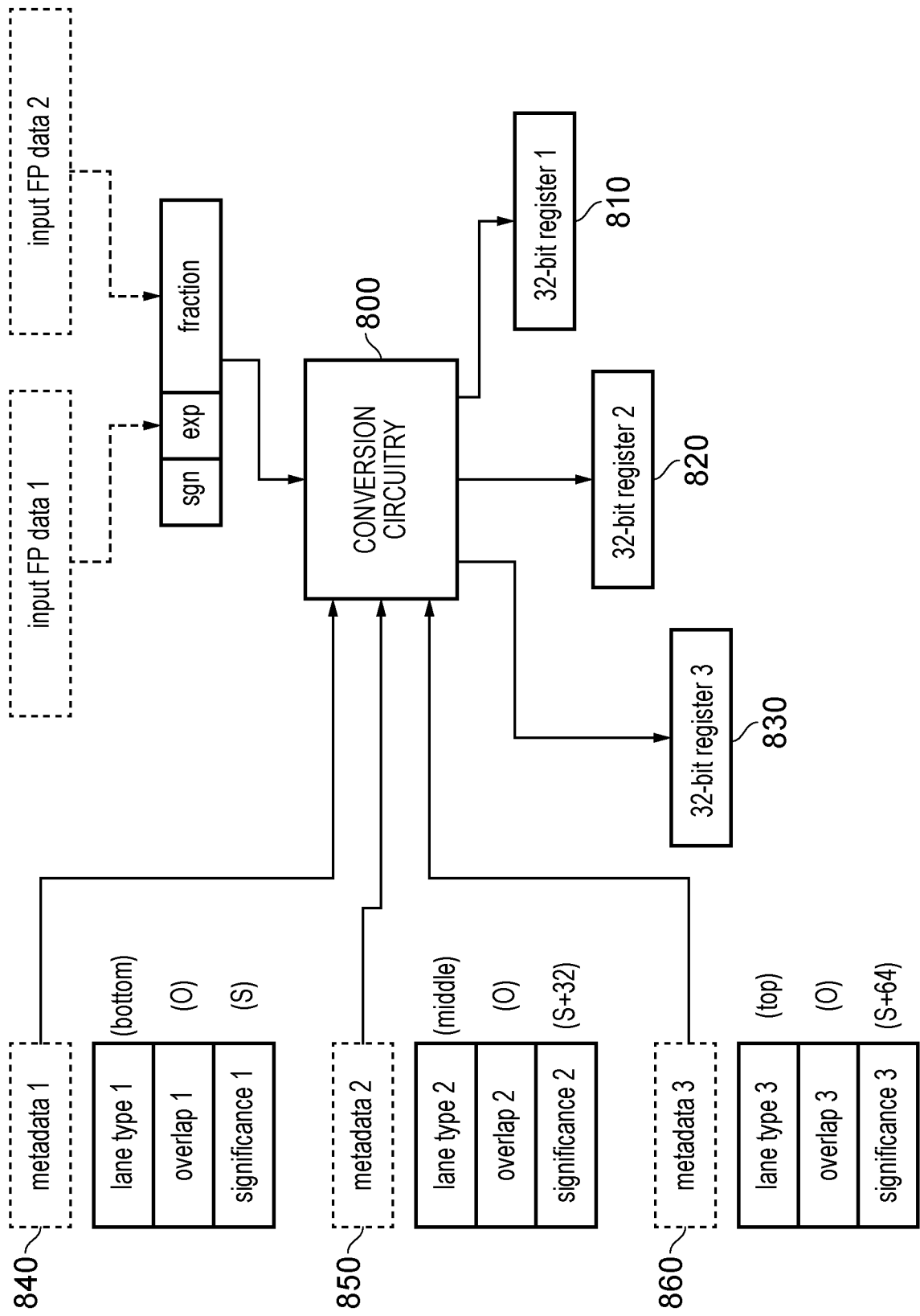
FIG. 19 illustrates how conversion circuitry may be used to produce a plurality of anchored-data select values.

FIG. 19 illustrates how conversion circuitry 800, such as that illustrated with respect to FIG. 16 may be used to produce a plurality of anchored-data select values. In this example, a pair of floating-point numbers are multiplied together to produce a sign, exponent, and fraction as previously described. In this example, it is assumed that the significand of the product (including the implicit integer bits) is 53 bits, i.e. the result is a double precision number. This is passed to the conversion circuitry 800. In practice, the double precision number may be passed as an input to a plurality of processing lanes, each with its own conversion circuitry 800. However, the double precision number can also be passed to the conversion circuitry across a number of processor cycles. In any event, the output of the conversion is passed to three 32-bit registers 810, 820, 830. Since there are no overlap bits, the three 32-bit registers can be used to collectively store a total of 96 bits, which is significantly more than the 53 bits being provided. It will therefore be necessary to perform padding, as will be discussed with respect to FIG. 20. Nevertheless, with the output being provided to three registers, three conversions take place.

With each conversion, different metadata is provided. The first metadata 840 relates to the output produced for the first 32-bit register 810. This indicates that the output relates to a first (bottom) lane, that there are no overlap bits, and it sets the significance of the lowest bit to be stored in the first 32-bit register 810 as s. The second metadata 850 relates to the output produced for the second 32-bit register 820. This indicates that the output relates to a second (middle) lane, that there are again no overlap bits, and its sets the significance of the lowest bit to be stored in the second 32-bit register 820 as s+32. If there were v overlap bits in the first register 810 then the significance would be s+32-v. Finally, the third metadata 860 relates to the output produced for the third 32-bit register 830. This indicates that the output relates to a third (top) lane, that there are no overlap bits, and sets the significance of the lowest bit to be s+32+32=s+64.

Consequently, those bits of the significance of the double precision input number that have a significance (according to the exponent) between s and s+31 are placed in the first register 810. Bits with significance between s+32 and s+63 are placed in the second register 820, and bits with significance between s+64 and s+96 are placed in the third register. Bits falling outside this range of significance (i.e. below s or above s+96) cause underflow or overflow conditions, respectively.

Figure 20:
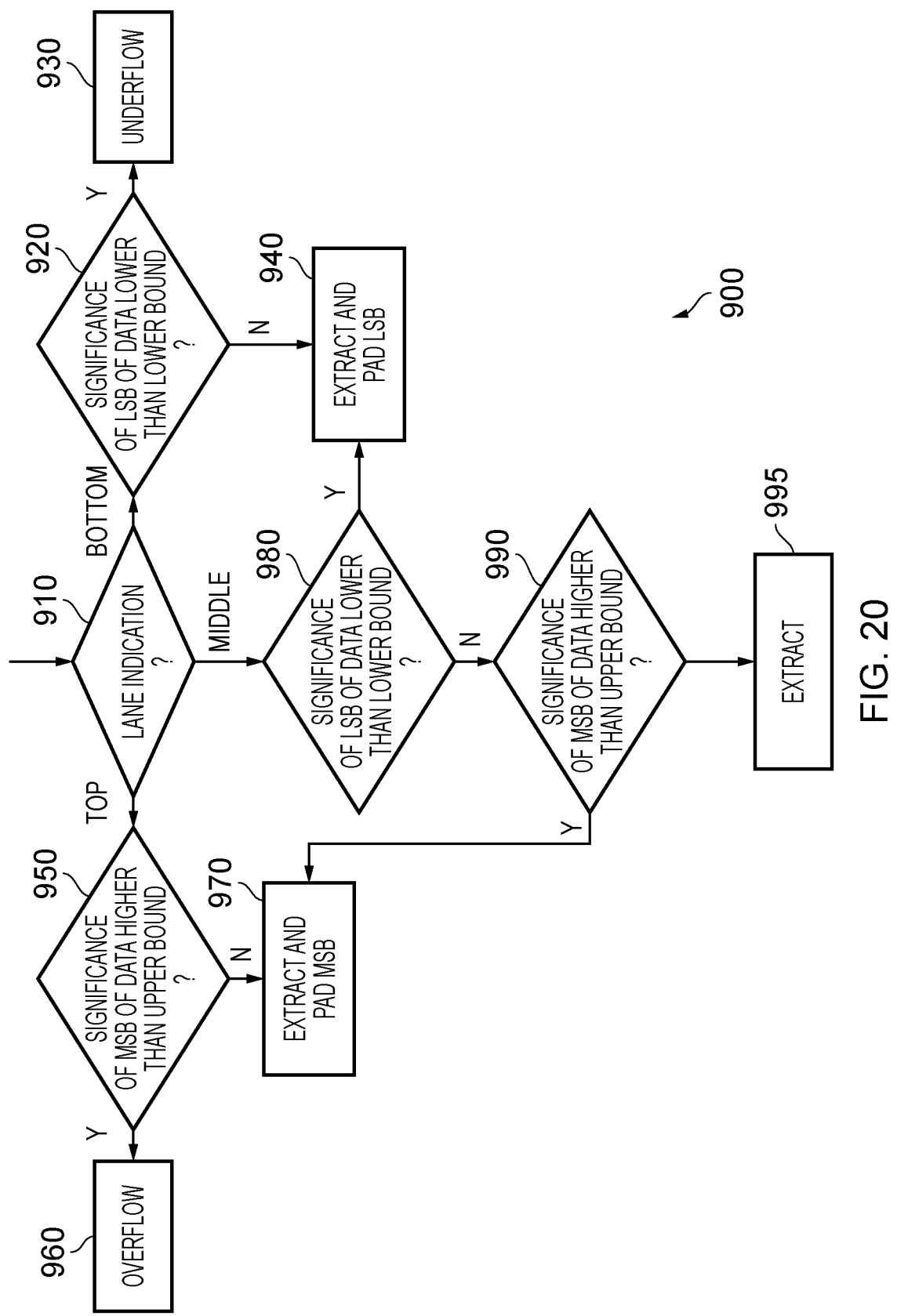
FIG. 20 illustrates how the extraction process described with reference to FIG. 16 occurs with padding.

FIG. 20 illustrates how the extraction process described with reference to FIG. 16 occurs with padding. The process starts at 910 where it is determined what the lane indicator for the current conversion is. If the lane conversion rates to the bottom lane, then at step 920, it is determined whether a significance of the least significant bit of the data value being converted is lower than a lower bound of the range of significance indicated by the metadata. In other words, it is determined whether the metadata is unable to support bits of such low significance. If yes, then at step 930 an underflow occurs. This could result in an underflow error being raised, or this could simply be ignored, depending on the implementation. In any event, if the answer at step 920 is no, then the relevant bits are extracted (as described with reference to FIG. 16) and the least significant bits are padded with the padding depending on whether the value is positive or negative (e.g. with 0 in the case of a positive number, or with 1 in the case of a negative number being stored in twos complement format). If, at step 910, then lane indication is that the conversion is for a top lane, then at step 950, it is determined whether a significance of the most significant bit of the data to be converted is higher than an upper bound of the range of significance indicated by the metadata. In other words, it is determined whether the metadata is unable to support bits of such high significance. If so, then at step 960, an overflow occurs. Unlike an underflow, an overflow will generally be expected to result in an error since this indicates that significant bits must be disregarded. Otherwise, at step 970, the relevant bits are extracted (as described with reference to FIG. 16) and the most-significant bits are padded with the padding depending on whether the value is positive or negative. If, at step 910, the lane is determined to be a middle lane, then at step 980, it is determined whether a significance of the least-significant bit of the data is lower than a lower bound. If so, then at step 940, the least-significant bits are padded as previously described. Otherwise, at step 990, it is determined whether a significance of the most significant bit of the data value is higher than the upper bound. If so, then the extraction occurs with padding of the most significant bits as previously described in step 970. If not, then the bits are simply extracted at step 995.

The above process recognises that if the metadata is unable to accommodate the significance of the data value being converted due to the bits being too insignificant or too significant then an underflow or overflow occurs as appropriate. However, in this example, this occurs only when the lane being processed is the bottom lane or top lane as appropriate. This is because an overflow cannot occur unless the top lane is being processed—any bits that are too significant for the current lane may still be representable by a higher lane. Similarly an underflow cannot occur unless the bottom lane is being processed—any bits that are too insignificant for the current lane may still be representable in a lower lane. In other cases (including for middle lanes) padding may occur where appropriate, e.g. where the data is of sufficiently high or low significance for the current lane, that extra bits must be added.

Consider the example of converting the 53-bit significand 1.00011 . . . 111 where the exponent is 55. The most significant bit has a significance of 55. If, when processing the top lane, the range of significance only extends as far as 50 (e.g. if the register has 50 non-overlap bits, and the anchor is 0) then the top 3 bits cannot be represented, and thus an overflow occurs. If the significance extends as far as 57 (e.g. if the register has 50 non-overlap bits and the anchor is 7) then padding must take place for the top 4 bits, which are otherwise undefined.

Now consider the example of converting the 53-bit significand 1.00011 . . . 111 where the exponent is 107. The least significant bit has a significance of 55. If, when processing the bottom lane, the range of significance only goes as low as 59 (e.g. if the anchor itself is 59) then the bottom 4 bits cannot be represented and so an underflow occurs. If the significance goes as low as 51 (e.g. the anchor is 51) then padding must occur in order to represent the otherwise undefined bottom 4 bits.

In this manner underflow and overflow conditions are handled and in other cases, where bits are defined, the extracted bits are padded so that they can be represented properly.

The values of the bits that make up the padding depend on whether the overall value is positive or negative. In the case where the overall value is positive then the padding is made up of zeros. In the case where the overall value is negative, then the extracted bits are padded with zeros, the twos complement form of the extracted bits is then formed by inverting the bits and adding a '1'. Consider the situation in which there are eight extracted bits (1010_1100), and each lane is 12 bits. This would necessitate padding using four bits as previously discussed. In this situation, we will assume that the bits are added in a most significant position, giving bbbb_1010_1100. If the overall value is positive then these bits will each have the value '0', thereby giving 0000_1010_1100. If the overall value is negative then these bits initially each have the value '0', thereby giving 0000_1010_1100. This is then converted to a twos complement number by firstly inverting the bits to give 1111_0101_0011 and then adding '1' to give 111101010100.

Figure 21:
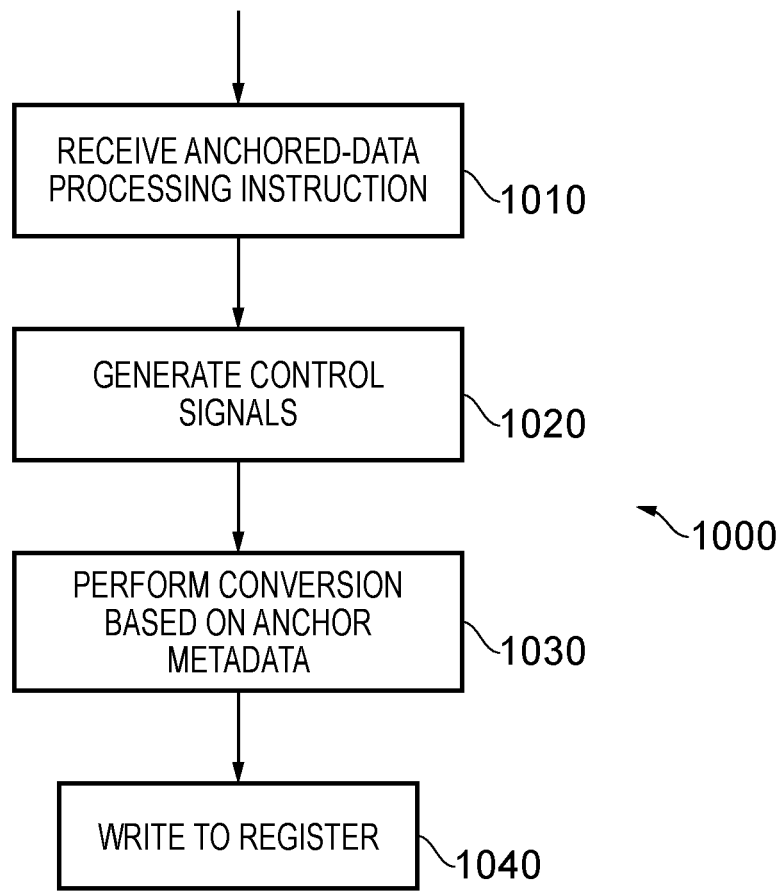
FIG. 21 illustrates a flowchart that shows a method of data processing in accordance with some embodiments.

FIG. 21 illustrates a flowchart 1000 that shows a method of data processing in accordance with some embodiments. At a step 1010, an anchored-data processing instruction is received. At a step 1020, control signals are generated that correspond with the anchored-data processing instruction. At a step 1030, the control signals cause a conversion of a data value to take place based on anchor metadata in order to produce an anchored-data select value. At a step 1040, the converted anchored-data select value is written to a register.

Figure 22:
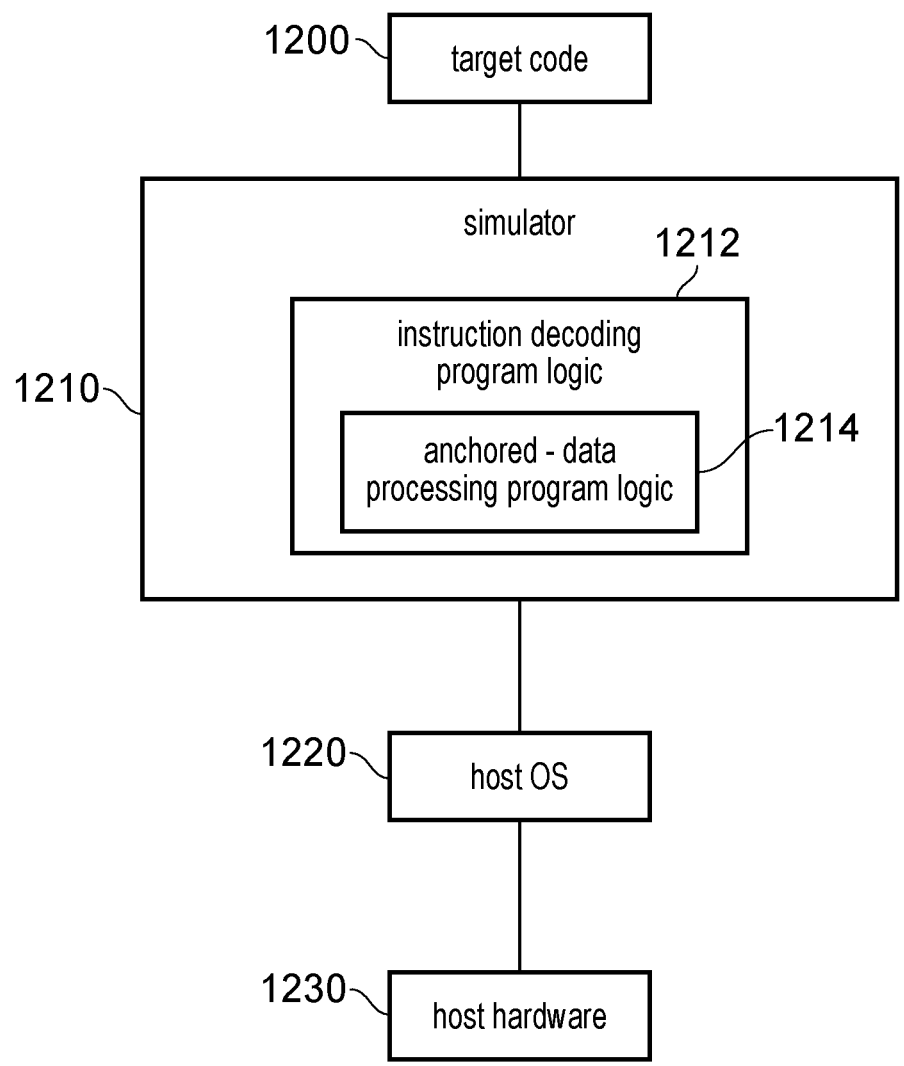
FIG. 22 shows a simulator example that may be used in accordance with some examples.

FIG. 22 illustrates a simulator implementation that may be used. Whilst the earlier described embodiments implement the present invention in terms of apparatus and methods for operating specific processing hardware supporting the techniques concerned, it is also possible to provide an instruction execution environment in accordance with the embodiments described herein which is implemented through the use of a computer program. Such computer programs are often referred to as simulators, insofar as they provide a software based implementation of a hardware architecture. Varieties of simulator computer programs include emulators, virtual machines, models, and binary translators, including dynamic binary translators. Typically, a simulator implementation may run on a host processor 1230, optionally running a host operating system 1220, supporting the simulator program 1210. In some arrangements, there may be multiple layers of simulation between the hardware and the provided instruction execution environment, and/or multiple distinct instruction execution environments provided on the same host processor. Historically, powerful processors have been required to provide simulator implementations which execute at a reasonable speed, but such an approach may be justified in certain circumstances, such as when there is a desire to run code native to another processor for compatibility or re-use reasons. For example, the simulator implementation may provide an instruction execution environment with additional functionality which is not supported by the host processor hardware, or provide an instruction execution environment typically associated with a different hardware architecture. An overview of simulation is given in "Some Efficient Architecture Simulation Techniques", Robert Bedichek, Winter 1990 USENIX Conference, Pages 53-63.

To the extent that embodiments have previously been described with reference to particular hardware constructs or features, in a simulated embodiment, equivalent functionality may be provided by suitable software constructs or features. For example, particular circuitry may be implemented in a simulated embodiment as computer program logic. Similarly, memory hardware, such as a register or cache, may be implemented in a simulated embodiment as a software data structure. In arrangements where one or more of the hardware elements referenced in the previously described embodiments are present on the host hardware (for example, host processor 430), some simulated embodiments may make use of the host hardware, where suitable.

The simulator program 1210 may be stored on a computer-readable storage medium (which may be a non-transitory medium), and provides a program interface (instruction execution environment) to the target code 1200 (which may include applications, operating systems and a hypervisor) which is the same as the application program interface of the hardware architecture being modelled by the simulator program 1210. Thus, the program instructions of the target code 1200, including instructions supporting processing of HPA values as described above, may be executed from within the instruction execution environment using the simulator program 1210, so that a host computer 1230 which does not actually have the hardware features of the apparatus discussed above can emulate these features. The simulator program 1210 may include instruction decoding program logic 1212 for decoding the instructions of the target code 1200 and mapping them to native instructions supported by the host hardware 1230. The instruction decoding program logic 1212 includes anchored-data processing program logic 1214 which maps HPA processing instructions to sets of native instructions for performing HPA (anchored-data processing) operations such as FP conversions, additions or overlap propagation/clearing operations as discussed above.

The present technique can also be configured according to one or more of the following clauses:

(1) An apparatus comprising: processing circuitry to perform data processing; and an instruction decoder to control the processing circuitry to perform an anchored-data processing operation to generate an anchored-data element; in which: the anchored-data element has an encoding including type information indicative of whether the anchored-data element represents: a portion of bits of a two's complement number, said portion of bits corresponding to a given range of significance representable using the anchored-data element; or a special value other than said portion of bits of a two's complement number.

(2) The apparatus according to clause 1, in which the processing circuitry is configured to store the type information in the same register as the anchored-data element.

(3) The apparatus according to clause 1, in which the anchored-data processing operation comprises a float-to-anchored conversion operation to convert a floating-point value to said anchored-data element.

(4) The apparatus according to clause 3, in which when the floating-point value represents a special number, the processing circuitry is configured to generate the anchored-data element with the type information indicating that the anchored-data element represents said special value.

(5) The apparatus according to clause 4, in which the type information distinguishes whether the special number represented by the floating-point value is positive infinity, negative infinity, or a Not-a-Number.

(6) The apparatus according to clause 3, in which in the float-to-anchored conversion operation, the processing circuitry is configured to generate said anchored-data element based on anchor metadata indicative of said given range of significance for the anchored-data element.

(7) The apparatus according to clause 1, in which the type information specifies whether the anchored-data element is a saturated type of anchored-data element which is dependent on one of: a previous anchored-data processing operation which caused a corresponding anchored-data element to overflow; and a previous float-to-anchored conversion operation for which the floating-point value was outside an allowed numeric range for an anchored-data value comprising one or more anchored-data elements.

(8) The apparatus according to clause 7, in which in a float-to-anchored conversion operation to convert a floating-point value to said anchored-data element, the processing circuitry is configured to set the type information of said anchored-data element to indicate said saturated type when one of: said anchored-data element is to represent a most significant element of an anchored-data value comprising one or more anchored-data values, and representing the floating-point value as a two's complement number would require at least one bit of greater significance than the given range of significance representable using said anchored-data element; or said anchored-data element is to represent a least significant element of an anchored-data value comprising one or more anchored-data values, and representing the floating-point value as a two's complement number would require at least one bit of lower significance than the given range of significance representable using said anchored-data element.

(9) The apparatus according to clause 7, in which an encoding of the type information is incapable of distinguishing, for an anchored-data element specified as the saturated type, whether the anchored-data element represents a positive or negative value.

(10) The apparatus according to clause 7, in which the processing circuitry comprises adding circuitry to perform an addition of two anchored-data elements to generate a result anchored-data element; in which: when the addition of the two anchored-data elements causes an overflow when generating a result anchored-data element representing a most significant element of an anchored-data value comprising one or more anchored-data elements each indicative of a respective portion of bits of a two's complement number represented by the anchored data value, the adding circuitry is configured to generate the result anchored-data element with the type information specifying that the result anchored-data element is the saturated type.

(11) The apparatus according to clause 1, in which the anchored-data element has an encoding in which: when a predetermined bit of the anchored-data element has a first value, the anchored-data element represents said portion of bits of a two's complement number; and when said predetermined bit of the anchored-data element has a second value, the anchored-data element represents said special value.

(12) The apparatus according to clause 11, in which when said predetermined bit of the anchored-data element has said second value, at least one further bit of the anchored-data element represents which type of special value is represented by the anchored-data element.

(13) The apparatus according to clause 12, in which when said predetermined bit of the anchored-data element has said first value, said at least one further bit of the anchored-data element represents part of said portion of the two's complement number or at least one overlap bit for accommodating carries from a part of the anchored-data element representing said portion of the two's complement number.

(14) The apparatus according to clause 11, in which said predetermined bit is a most significant bit of the anchored-data element.

(15) The apparatus according to clause 1, in which in a given anchored-data processing operation, when an input anchored-data element has said type information specifying that the input anchored-data element is a special value, the processing circuitry is configured to generate a corresponding result anchored-data element with said type information specifying that the result anchored-data element is a special value.

(16) The apparatus according to clause 1, in which the processing circuitry comprises adding circuitry to perform an addition of two anchored-data elements to generate a result anchored-data element, and when two type information of the two anchored-data elements indicates that one of the two anchored-data elements represents positive infinity and the other of the two anchored-data elements represents negative infinity, the adding circuitry is configured to generate the result anchored-data element with type information specifying that the result anchored-data element represents a Not-a-Number.

(17) The apparatus according to clause 1, in which said anchored-data element is an N-bit value including V overlap bits and W non-overlap bits; and in a float-to-anchored conversion operation for converting a floating-point value to the anchored-data element, when the floating-point value represents a number other than a special number, and the number represented by the floating-point value is within an allowed numeric range, the processing circuitry is configured to set the W non-overlap bits of the anchored-data element to represent a portion of bits of the two's complement number corresponding to the floating-point value, and to set the V overlap bits of the anchored-data element to a sign-extension of the W non-overlap bits.

(18) The apparatus according to clause 17, in which N−V−W>0.

(19) The apparatus according to clause 17, in which the processing circuitry is responsive to an overlap propagation instruction to align the V overlap bits of a first anchored-data element with W non-overlap bits of a second anchored-data element, and add the aligned overlap bits and non-overlap bits to generate an updated value for the second anchored-data element.

(20) The apparatus according to clause 19, in which in response to the overlap propagation instruction, when one of the first anchored-data element and the second anchored-data element has type information specifying said special value, the processing circuitry is configured to perform one of: retain a previous value of the second anchored-data element; or when the type information of the first anchored-data element indicates a special value, propagate the type information of the first anchored-data element to the type information of the second anchored-data element.

(21) The apparatus according to clause 19, in which when the addition of the aligned overlap bits and non-overlap bits causes an overflow of the second anchored-data element, the processing circuitry is configured to set the type information for the second anchored-data element to indicate a saturated type value.

(22) The apparatus according to clause 17, in which the processing circuitry is responsive to an overlap clearing instruction to clear the overlap bits of a target anchored-data element to zero.

(23) The apparatus according to clause 22, in which in response to the overlap clearing instruction, when the target anchored-data element has type information specifying said special value, the processing circuitry is configured to retain a previous value of the target anchored-data element.

(24) A computer program for controlling a host data processing apparatus to provide an instruction execution environment for execution of instructions; the computer program comprising: instruction decoding program logic to decode program instructions of target code to control the host data processing apparatus to perform data processing; said instruction decoding program logic including anchored-data processing program logic to control the host data processing apparatus to perform an anchored-data processing operation to generate an anchored-data element, in which: the anchored-data element has an encoding including type information indicative of whether the anchored-data element represents: a portion of bits of a two's complement number, said portion of bits corresponding to a given range of significance representable using the anchored-data element; or a special value other than said portion of bits of a two's complement number.

(25) A data processing method comprising: decoding one or more instructions; and in response to the decoded instructions, controlling processing circuitry to perform an anchored-data processing operation to generate an anchored-data element, in which: the anchored-data element has an encoding including type information indicative of whether the anchored-data element represents: a portion of bits of a two's complement number, said portion of bits corresponding to a given range of significance representable using the anchored-data element; or a special value other than said portion of bits of a two's complement number.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. An apparatus comprising:
an instruction decoder responsive to an anchored-data processing instruction, to generate one or more control signals;
conversion circuitry, responsive to the one or more control signals, to perform a conversion from a data value to an anchored-data select value that is at most part of an anchored-data value, wherein the conversion is based on anchor metadata indicative of a given range of significance for the anchored-data select value that is at most part of an anchored-data value; and
output circuitry, responsive to the one or more control signals, to write the anchored-data select value that is at most part of an anchored-data value to a register.

2. The apparatus according to claim 1, wherein
the conversion circuitry is adapted to extract selected bits from the data value corresponding to the given range of significance for the anchored-data select value.

3. The apparatus according to claim 1, wherein
the data value is either a floating-point number or a or at least a part of a product of two floating-point numbers.

4. The apparatus according to claim 1, wherein
the anchored-data processing instruction is an anchored-data multiplication instruction; and
the anchored-data multiplication instruction causes the processing circuitry to perform a multiplication between two floating-point numbers to produce the data value comprising a sign bit, an exponent and an unrounded significand comprising at least one integer bit.

5. The apparatus according to claim 4, wherein
the conversion circuitry is adapted to extract selected bits from the unrounded significand that correspond to the given range of significance for the anchored-data select value; and
a significance of the selected bits is determined from at least the exponent.

6. The apparatus according to claim 5, wherein
the selected bits are selected from bits making up the unrounded significand having a significance that falls within the given range of significance for the anchored-data select value.

7. The apparatus according to claim 1, wherein
the anchor metadata comprises a lane indication of whether the anchored-data select value belongs to a bottom lane or to a top lane.

8. The apparatus according to claim 7, wherein
the anchored-data multiplication instruction causes the processing circuitry to perform a multiplication between two floating-point numbers to produce the data value comprising a sign bit, an exponent and an unrounded significand comprising at least one integer bit;
the conversion circuitry is adapted to extract selected bits from the unrounded significand that correspond to the given range of significance for the anchored-data select value; and
when the lane indication indicates that the anchored-data select value belongs to the bottom lane:
if a significance of a least significant bit of the data value is lower than a lower bound of the given range of significance then the conversion circuitry is adapted to signal an underflow,
otherwise the conversion circuitry is adapted to pad the selected bits extracted from the unrounded significand at a least significant position.

9. The apparatus according to claim 7, wherein
the anchored-data multiplication instruction causes the processing circuitry to perform a multiplication between two floating-point numbers to produce the data value comprising a sign bit, an exponent and an unrounded significand comprising at least one integer bit;
the conversion circuitry is adapted to extract selected bits from the unrounded significand that correspond to the given range of significance for the anchored-data select value; and
when the lane indication indicates that the anchored-data select value belongs to the top lane:
if a significance of a most significant bit of the data value is higher than an upper bound of the given range of significance then the conversion circuitry is adapted to signal an overflow,
otherwise the conversion circuitry is adapted to sign extend the selected bits extracted from the unrounded significand.

10. The apparatus according to claim 7, wherein
the anchored-data multiplication instruction causes the processing circuitry to perform a multiplication between two floating-point numbers to produce the data value comprising a sign bit, an exponent and an unrounded significand comprising at least one integer bit;
the conversion circuitry is adapted to extract selected bits from the unrounded significand that correspond to the given range of significance for the anchored-data select value; and
when the lane indication indicates that the anchored-data select value belongs to neither the bottom lane nor the top lane:
when a significance of a least significant bit of the data value is higher than a lower bound of the given range of significance then the conversion circuitry is adapted to pad the selected bits extracted from the unrounded significand at a least significant position; and
when a significance of a most significant bit of the data value is lower than an upper bound of the given range of significance then the conversion circuitry is adapted to the selected bits extracted from the unrounded significand at a most significant position.

11. The apparatus according to claim 7, wherein
in response to one of the two float-point numbers being a floating point special case when the lane indication indicates that the anchored-data select value belongs to the top lane, the floating point special case is indicated in the register.

12. The apparatus according to claim 1, wherein
the anchored-data processing instruction is an anchored-data extraction instruction; and
the data value is a floating-point number comprising a sign bit, an exponent, and a significand.

53

13. The apparatus according to claim 12, wherein
the conversion circuitry is adapted to extract selected bits from the unrounded significand that correspond to the given range of significance for the anchored-data select value; and
a significance of the selected bits is determined from at least the exponent.

14. The apparatus according to claim 13, wherein
the selected bits are selected from bits making up the unrounded significand having a significance that falls within the given range of significance for the anchored-data select value.

15. The apparatus according to claim 12, wherein
the anchor metadata comprises a lane indication of whether the anchored-data select value belongs to a bottom lane or to a top lane.

16. The apparatus according to claim 15, wherein
the conversion circuitry is adapted to extract selected bits from the data value that correspond to the given range of significance for the anchored-data select value; and
when the lane indication indicates that the anchored-data select value belongs to the bottom lane:
  if a significance of a least significant bit of the data value is lower than a lower bound of the given range of significance then the conversion circuitry is adapted to signal an underflow,
  otherwise the conversion circuitry is adapted to pad the selected bits extracted from the unrounded significand at a least significant position.

17. The apparatus according to claim 15, wherein
the conversion circuitry is adapted to extract selected bits from the data value that correspond to the given range of significance for the anchored-data select value; and
when the lane indication indicates that the anchored-data select value belongs to the top lane:
  if a significance of a most significant bit of the data value is higher than an upper bound of the given range of significance then the conversion circuitry is adapted to signal an overflow,
  otherwise the conversion circuitry is adapted to pad the selected bits extracted from the unrounded significand at a most significant position.

18. The apparatus according to claim 15, wherein
the conversion circuitry is adapted to extract selected bits from the data value that correspond to the given range of significance for the anchored-data select value; and
when the lane indication indicates that the anchored-data select value belongs to neither the bottom lane:

54 when a significance of a least significant bit of the data value is higher than a lower bound of the given range of significance then the conversion circuitry is adapted to pad the selected bits extracted from the unrounded significand at a least significant position; and
  when a significance of a most significant bit of the data value is lower than an upper bound of the given range of significance then the conversion circuitry is adapted to pad the selected bits extracted from the unrounded significand at a most significant position.

19. A data processing method comprising:
receiving, by an instruction decoder, an anchored-data processing instruction;
generating, by the instruction decoder, one or more control signals in response to the anchored-data processing instruction;
performing by conversion circuitry, in response to the one or more control signals, a conversion from a data value to an anchored-data select value that is at most part of an anchored-data value, wherein the conversion is based on anchor metadata indicative of a given range of significance for the anchored-data select value that is at most part of an anchored-data value; and
writing, by output circuitry, in response to the one or more control signals, the anchored-data select value that is at most part of an anchored-data value to a register.

20. A computer program stored on a non-transitory, computer-readable medium which when executed causes a host data processing apparatus to perform the following operations:
receive at a decoder an anchored-data processing instruction and generate one or more control signals in response to the anchored-data processing instruction;
in response to the one or more control signals, conversion circuitry performing a conversion from a data value to an anchored-data select value that is at most part of an anchored-data value, wherein the conversion is based on anchor metadata indicative of a given range of significance for the anchored-data select value that is at most part of an anchored-data value; and
in response to the one or more control signals, output circuitry writing the anchored-data select value that is at most part of an anchored-data value to a data structure in the instruction execution environment.

* * * * *